US012727307B2

(12) United States Patent
Lee et al.

(10) Patent No.: US 12,727,307 B2
(45) Date of Patent: Sep. 1, 2026

(54) DISPLAY DEVICE AND METHOD OF FABRICATING THE SAME

(71) Applicant: Samsung Display Co., LTD., Yongin-si (KR)

(72) Inventors: Ji Hye Lee, Yongin-si (KR); Jin Seon Kwak, Yongin-si (KR); Kyung Bae Kim, Yongin-si (KR); Yong Hee Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 743 days.

(21) Appl. No.: 18/192,158

(22) Filed: Mar. 29, 2023

(65) Prior Publication Data

US 2024/0006570 A1 Jan. 4, 2024

(30) Foreign Application Priority Data

Jul. 4, 2022 (KR) ........................ 10-2022-0081743

(51) Int. Cl.

| | |
|---|---|
| ***H01L 33/62*** | (2010.01) |
| ***H10D 86/40*** | (2025.01) |
| ***H10D 86/60*** | (2025.01) |
| ***H10H 20/857*** | (2025.01) |
| ***H10W 90/00*** | (2026.01) |

(52) U.S. Cl.
CPC ........ *H10H 20/857* (2025.01); *H10D 86/441* (2025.01); *H10D 86/60* (2025.01); *H10W 90/00* (2026.01)

(58) Field of Classification Search
CPC .... H10H 20/857; H10D 86/441; H10D 86/60; H01L 25/0753
See application file for complete search history.

(56) References Cited

U.S. PATENT DOCUMENTS 8,049,410 B2 11/2011 Suh et al.
11,626,061 B2 4/2023 An et al.
2013/0145334 A1 * 6/2013 Nojima ................. G06F 30/398 716/115
2018/0149906 A1 * 5/2018 Kanehiro .......... G02F 1/133351
2020/0329557 A1 * 10/2020 Kim ....................... H05K 1/118
(Continued)

FOREIGN PATENT DOCUMENTS

KR 10-0839754 B1 6/2008
KR 10-2016-0054664 5/2016
(Continued)

*Primary Examiner* — William C Trapanese
(74) *Attorney, Agent, or Firm* — Womble Bond Dickinson (US) LLP

(57) ABSTRACT

A display device that includes a display area and a non-display area surrounding the display area, a substrate, pixels disposed in the display area of the substrate, a grounding part disposed in the non-display area of the substrate, and a flexible printed circuit board disposed in the non-display area of the substrate to apply a driving signal to drive the pixels, wherein the non-display area includes first through fourth portions, the fourth portion on which the flexible printed circuit board is disposed, and the second portion spaced-apart from the fourth portion by the display area, the grounding part including a first ground pattern and a second ground pattern that are arranged alternately in the second portion of the non-display area.

20 Claims, 24 Drawing Sheets

(56) References Cited

U.S. PATENT DOCUMENTS

| | | | | |
|---|---|---|---|---|
| 2021/0195739 | A1 * | 6/2021 | Bae | H05K 1/0224 |
| 2021/0202905 | A1 * | 7/2021 | Lee | H10K 77/00 |
| 2023/0035645 | A1 * | 2/2023 | Hong | H05K 1/165 |
| 2023/0061333 | A1 * | 3/2023 | Cho | H05K 1/189 |

FOREIGN PATENT DOCUMENTS

| | | | |
|---|---|---|---|
| KR | 10-2020-0034906 | | 4/2020 |
| KR | 10-2020-0145928 | A | 12/2020 |

* cited by examiner

SPXn: SPX1, SPX2, SPX3

1

PX

SPX1 SPX2 SPX3

A1

SA
ROP
CT1 CT2
CTD CTS
BNL
CNE2
CNE1
ED
RME1
EMA EMA EMA
RME2
SA
ROP

RME: RME1, RME2
CNE: CNE1, CNE2

130: 131, 132
131: 131a, 131b
132: 132a, 132b
RSE: RSE1, RSE2

DISPLAY DEVICE AND METHOD OF FABRICATING THE SAME

CROSS REFERENCE TO RELATED APPLICATION

This application claims priority under 35 U.S.C. § 119 from Korean Patent Application No. 10-2022-0081743 filed on Jul. 4, 2022 in the Korean Intellectual Property Office, the disclosure of which is incorporated herein by reference in its entirety.

BACKGROUND

1. Technical Field

The disclosure relates to a display device, and a method of fabricating the same.

2. Description of the Related Art

Display devices have become more and more important as multimedia technology evolves. Accordingly, a variety of types of display devices such as organic light-emitting display (OLED) devices and liquid-crystal display (LCD) devices may be currently used.

Display devices include a display panel such as an organic light-emitting display panel and a liquid-crystal display panel for displaying images. Among them, light-emitting display panel may include light-emitting elements. For example, light-emitting diodes (LEDs) may include an organic light-emitting diode (OLED) using an organic material as a fluorescent material, and an inorganic light-emitting diode using an inorganic material as a fluorescent material.

An inorganic light-emitting diode using an inorganic semiconductor as the fluorescent material has advantageous in that it has durability in a high-temperature environment and that it has a higher luminous efficiency for blue light than organic light-emitting diodes.

SUMMARY

Aspects of the disclosure provide a display device with improved luminous efficiency of pixels.

Aspects of the disclosure also provide a method of fabricating a display device with improved luminous efficiency of pixels.

It should be noted that objects of the disclosure may not be limited to the above-mentioned object; and other objects of the disclosure will be apparent to those skilled in the art from the following descriptions.

According to an embodiment of the disclosure a display device includes a display area and a non-display area surrounding a display area, a substrate, a plurality of pixels disposed in the display area, a grounding part disposed in the non-display area and a flexible printed circuit board disposed in the non-display area to apply a driving signal to drive the pixels, wherein the non-display area comprises a first portion, a second portion, a third portion, and a fourth portion, wherein the flexible printed circuit board being disposed in the fourth portion, the second portion being disposed opposite from the fourth portion and being spaced-apart from the fourth portion by the display area, and wherein the grounding part comprises a first ground pattern and a second ground pattern that are arranged alternately in the second portion of the non-display area.

In an embodiment, wherein the first portion extends from an end of the fourth portion to another end of the second portion; and the third portion being disposed opposite from the first portion and being spaced-apart from the first portion by the display area, and wherein the grounding part further comprises: a first ground line being arranged in the first portion; and a second ground line being arranged in the third portion.

In an embodiment, the substrate comprises a first peripheral edge, a second peripheral edge, a third peripheral edge, and a fourth peripheral edge, the third peripheral edge being arranged opposite from the first peripheral edge and extending from an end of the second peripheral edge to an end of the fourth peripheral edge, the second peripheral edge being arranged opposite from the fourth peripheral edge, the first peripheral edge extending from another end of the second peripheral edge to another end of the fourth peripheral edge, and wherein the first portion of the non-display area is arranged between the first peripheral edge and the display area, the second portion thereof is arranged between the second peripheral edge and the display area, the third portion thereof is arranged between the third peripheral edge and the display area, and the fourth portion thereof is arranged between the fourth peripheral edge and the display area.

In an embodiment, the first ground pattern and the second ground pattern may be spaced apart from both the second side and the display area.

In an embodiment, a display device may further comprise: a first signal line and a second signal line arranged alternately in the second portion of the non-display area, at least a part of the first signal line overlaps the first ground pattern in a thickness direction, and at least apart of the second signal line overlaps the second ground pattern in the thickness direction.

In an embodiment, the first signal line and the second signal line each extend from the second peripheral edge to the display area.

In an embodiment, the first ground pattern and the second ground pattern each extend in a direction intersecting a direction in which the first signal line and the second signal line extend.

In an embodiment, the first ground pattern and the second ground pattern are spaced apart from each other, and wherein the first signal line and the second signal line may be spaced apart from each other.

In an embodiment, a first voltage is applied to each of the first signal line and the first ground pattern, and a second voltage having a level different from that of the first voltage is applied to each of the second signal line and the second ground pattern.

In an embodiment, the first signal line and the first ground pattern are electrically connected with each other, and the second signal line and the second ground pattern are electrically connected with each other.

According to an embodiment of the disclosure a display device comprises a display area and a non-display area surrounding a display area, a substrate, a plurality of pixels disposed in the display area, first and second signal lines alternately and repeatedly arranged in the non-display area, and a first ground pattern and a second ground pattern alternately and repeatedly arranged in the non-display area, the first signal line and the first ground pattern overlap each other in a thickness direction and each receive a first voltage, and the second signal line and the second ground pattern overlap each other in the thickness direction and each receive a second voltage that has a level different from a level of the first voltage.

In an embodiment, a display device may further comprise a via insulating layer disposed between the substrate and the first signal line and between the substrate and the second signal line in the non-display area, the via insulating layer extending into to the display area, wherein the first signal line and the second signal line may be in direct contact with an upper surface of the via insulating layer.

In an embodiment, each of the pixels comprise a first electrode and a second electrode spaced apart from each other; and a plurality of light-emitting elements disposed in a space between the first electrode and the second electrode, and the first electrode and the second electrode are in direct contact with the upper surface of the via insulating layer.

In an embodiment, the first electrode, the second electrode, the first signal line and the second signal line comprises a same material.

In an embodiment, a display device may further comprise a thin-film transistor disposed between the via insulating layer and the substrate in the display area driving the light-emitting elements, wherein the thin-film transistor comprises a bottom metal layer that is in direct contact with an upper surface of the substrate, wherein in the non-display area, each of the first ground pattern and the second ground pattern comprises a first layer and a second layer disposed on the first layer, and the first layer of each of the first ground pattern and the second ground pattern is in direct contact with the upper surface of the substrate.

In an embodiment, the first layer of the first ground pattern, the first layer of the second ground pattern, and the bottom metal layer of the thin-film transistor comprise a same material.

In an embodiment, in the display area, the thin-film transistor further comprises a buffer layer disposed on the bottom metal layer, a semiconductor layer disposed on the buffer layer, a gate insulator disposed on the semiconductor layer and a gate electrode disposed on the gate insulator, the gate electrode of the thin-film transistor, the second layer of the first ground pattern, and the second layer of the second ground pattern comprises a same material.

In an embodiment, the buffer layer and the gate insulator each extend into the non-display area, in the non-display area, the buffer layer is disposed on the first layer of the first ground pattern and on the first layer of the second ground pattern, the gate insulator is in direct contact with an upper surface of the buffer layer, and the second layer of the first ground pattern and the second layer of the second ground pattern may be both in direct contact with an upper surface of the gate insulator.

In an embodiment, the first ground pattern and the second ground pattern are both electrically insulated from the first signal line and the second signal line by the via insulating layer.

In an embodiment, the first ground pattern and the second ground pattern are disposed between the substrate and the via insulating layer, the first signal line is in contact with and is electrically connected to the first ground pattern through a first contact hole that penetrates through the via insulating layer, and the second signal line is in contact with and electrically connected to the second ground pattern through a second contact hole that penetrates through the via insulating layer.

According to an embodiment of the disclosure, the luminous efficiency of pixels in a display device can be improved.

According to an embodiment of the disclosure, a method of fabricating a display device can provide a display device having improved luminous efficiency of pixels.

It should be noted that effects of the disclosure may not be limited to those described above and other effects of the disclosure will be apparent to those skilled in the art from the following descriptions.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
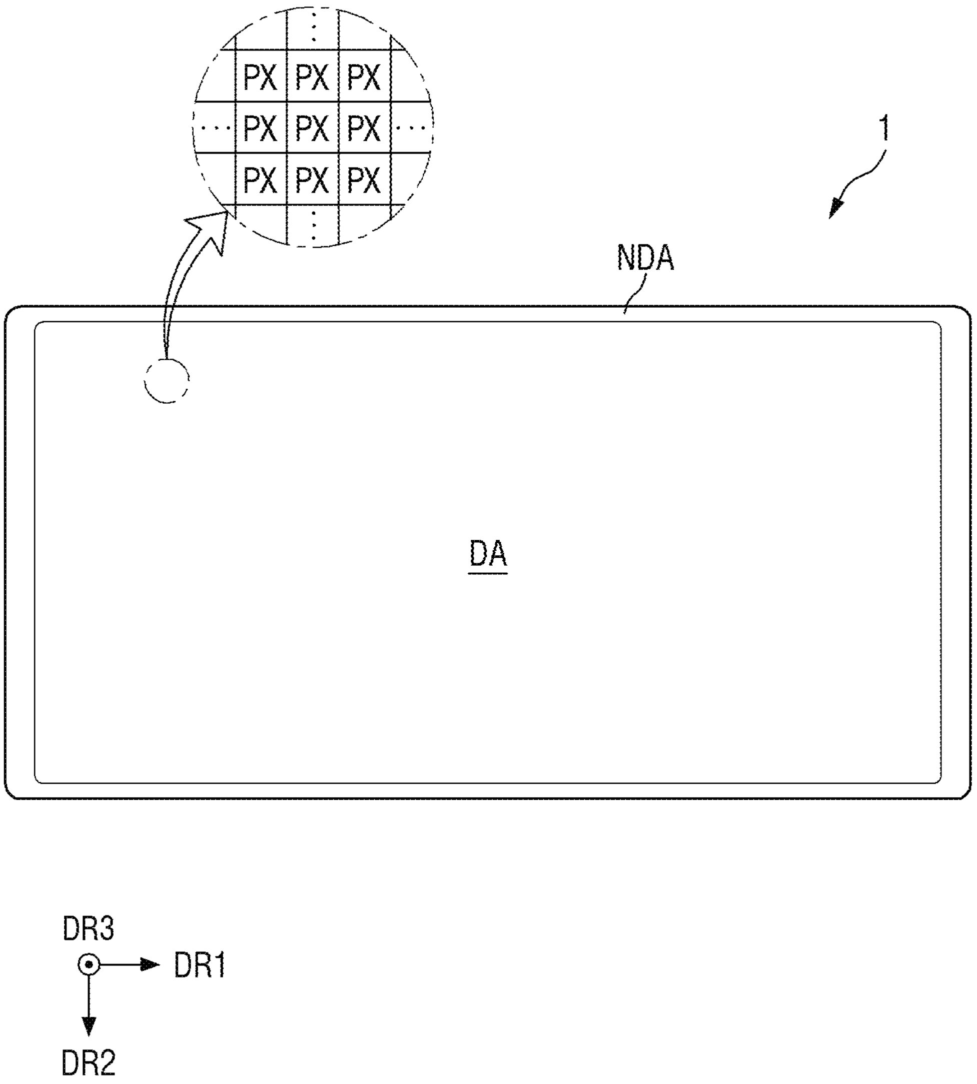
FIG. 1 is a plan view of a display device according to an embodiment of the disclosure.

The invention will now be described more fully hereinafter with reference to the accompanying drawings, in which embodiments of the invention may be shown. This disclosure may, however, be embodied in different forms and should not be construed as limited to the embodiments set forth herein. Rather, these embodiments may be provided so that this disclosure will be thorough and complete, and will fully convey the scope of the invention to those skilled in the art.

It will also be understood that when a layer is referred to as being "on" another layer or substrate, it can be on (e.g., directly on) the other layer or substrate, or intervening layers may also be present. Same reference numbers indicate same components throughout the specification.

It will be understood that, although the terms "first," "second," etc. may be used herein to describe various elements, these elements should not be limited by these terms. These terms may be only used to distinguish an element from another element. For instance, a first element discussed below could be termed a second element without departing from the teachings of the present disclosure. Similarly, the second element could also be termed the first element.

Features of each of various embodiments of the disclosure may be partially or entirely combined with each other and may technically and variously interwork with each other, and respective embodiments may be implemented independently of each other or may be implemented together in association with each other.

Spatially relative terms, such as “beneath,” “below,” “under,” “lower,” “on,” “above,” “upper,” “over,” “higher,” “side” (e.g., as in “sidewall”), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as “below” or “beneath” other elements or features would then be oriented “above” the other elements or features. Thus, the term “below” can encompass both an orientation of above and below. Furthermore, the apparatus may be otherwise oriented (e.g., rotated 90 degrees or at other orientations), and, as such, the spatially relative descriptors used herein should be interpreted accordingly.

When an element, such as a layer, is referred to as being “on,” “connected to,” or “coupled to” another element or layer, it may be directly on, connected to, or coupled to the other element or layer or intervening elements or layers may be present. When, however, an element or layer is referred to as being “directly on,” “directly connected to,” or “directly coupled to” another element or layer, there are no intervening elements or layers present. To this end, the term “connected” may refer to physical, electrical, and/or fluid connection, with or without intervening elements.

The term “and/or” includes all combinations of one or more of which associated configurations may define. For example, “A and/or B” may be understood to mean “A, B, or A and B.”

For the purposes of this disclosure, the phrase “at least one of A and B” may be construed as A only, B only, or any combination of A and B. Also, “at least one of X, Y, and Z” and “at least one selected from the group consisting of X, Y, and Z” may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described with reference to the accompanying drawings.

FIG. 1 is a plan view of a display device according to an embodiment of the disclosure.

In FIG. 1, a first direction DR1, a second direction DR2 and a third direction DR3 may be defined. The first direction DR1 and the second direction DR2 may be perpendicular to each other, the first direction DR1 and the third direction DR3 may be perpendicular to each other, and the second direction DR2 and the third direction DR3 may be perpendicular to each other. The first direction DR1 may refer to the horizontal direction in the drawings, the second direction DR2 may refer to the vertical direction in the drawings, and the third direction DR3 may refer to the up-and-down direction, i.e., the thickness direction in the drawings.

As used herein, a direction may refer to the direction indicated by the arrow as well as the opposite direction, unless specifically stated otherwise. If it is necessary to discern between such two opposite directions, one of the two directions may be referred to as “a side in the direction,” while the other direction may be referred to as “another side in the direction”. In FIG. 1, the side indicated by the arrow of a direction is referred to as one side in the direction, while the opposite side is referred to as the opposite side in the direction.

In the following description of the surfaces of the display device 1 or the elements of the display device 1, the surfaces facing a side where images may be displayed, i.e., the third direction DR3 will be referred to as the upper surface, while the opposite side will be referred to as the lower surface for convenience of illustration. It should be understood, however, that the disclosure is not limited thereto. The surfaces and the opposite surface of the elements may be referred to as a front surface and a rear surface, respectively, or may be referred to as a first surface and a second surface, respectively. In the description of relative positions of the elements of the display device 1, a side in the second direction DR2 may be referred to as the upper side while the another side in the second direction DR2 may be referred to as the lower side.

Referring to FIG. 1, the display device 1 displays a moving image or a still image. Display device 1 may refer to any electronic device that provides a display screen. For example, the display device 1 may include a television set, a laptop computer, a monitor, an electronic billboard, the Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console a digital camera, a camcorder, or a combination thereof.

The display device 1 includes a display panel for providing a display screen. Examples of the display panel may include an inorganic light-emitting diode display panel, an organic light-emitting display panel, a quantum-dot light-emitting display panel, a plasma display panel, a field emission display panel, etc. In the following description, an inorganic light-emitting diode display panel is employed as an example of the display panel, but the disclosure is not limited thereto. Any other display panel may be employed as long as the technical idea of the disclosure can be equally applied.

The shape of the display device 1 may be modified in a variety of ways. For example, the display device 1 may have shapes such as a rectangle with longer lateral sides, a rectangle with longer vertical sides, a square, a quadrangle with rounded corners (vertices), other polygons, a circle, etc. The shape of a display area DA of the display device 1 may also be similar to the overall shape of the display device 1. In the example shown in FIG. 1, the display device 1 has a rectangular shape with the longer sides in a first direction DR1.

The display device 1 may include the display area DA and a non-display area NDA. In the display area DA, images can be displayed. In the non-display area NDA, images may not be displayed. The display area DA may be referred to as an active area, while the non-display area NDA may also be referred to as an inactive area. The display area DA may generally occupy the center of the display device 1.

The display area DA may include pixels PX. The pixels PX may be arranged in a matrix. The shape of each pixel PX may be, but is not limited to, a rectangle or a square when viewed from the top. Each pixel may instead have a diamond shape having sides inclined with respect to a direction. The pixels PX may be arranged in stripes or in a pattern of islands. Each of the pixels PX may include one or more light-emitting elements each emitting light of a particular wavelength band to represent a color.

The non-display areas NDA may be disposed around the display area DA. The non-display area NDA may surround the display area DA entirely or partially. The display area DA may have a rectangular shape, and the non-display area NDA may be disposed to be adjacent to the four peripheral edges of the display area DA. The non-display area NDA may form the bezel of the display device 1. Lines (i.e., electrically conductive wires or signal trace or circuit trace) or circuit drivers included in the display device 1 may be disposed in the non-display area NDA, or external devices may be mounted.

The display area DA and the non-display area NDA may be equally applied to a substrate SUB (see FIG. 7) to be described later. For example, the area of the substrate SUB that overlaps the display area DA of the display device 1 will be the display area DA of the substrate SUB, while the other area of the substrate SUB that overlaps the non-display area NDA of the display device 1 will be the non-display area NDA of the substrate SUB.

Figure 2:
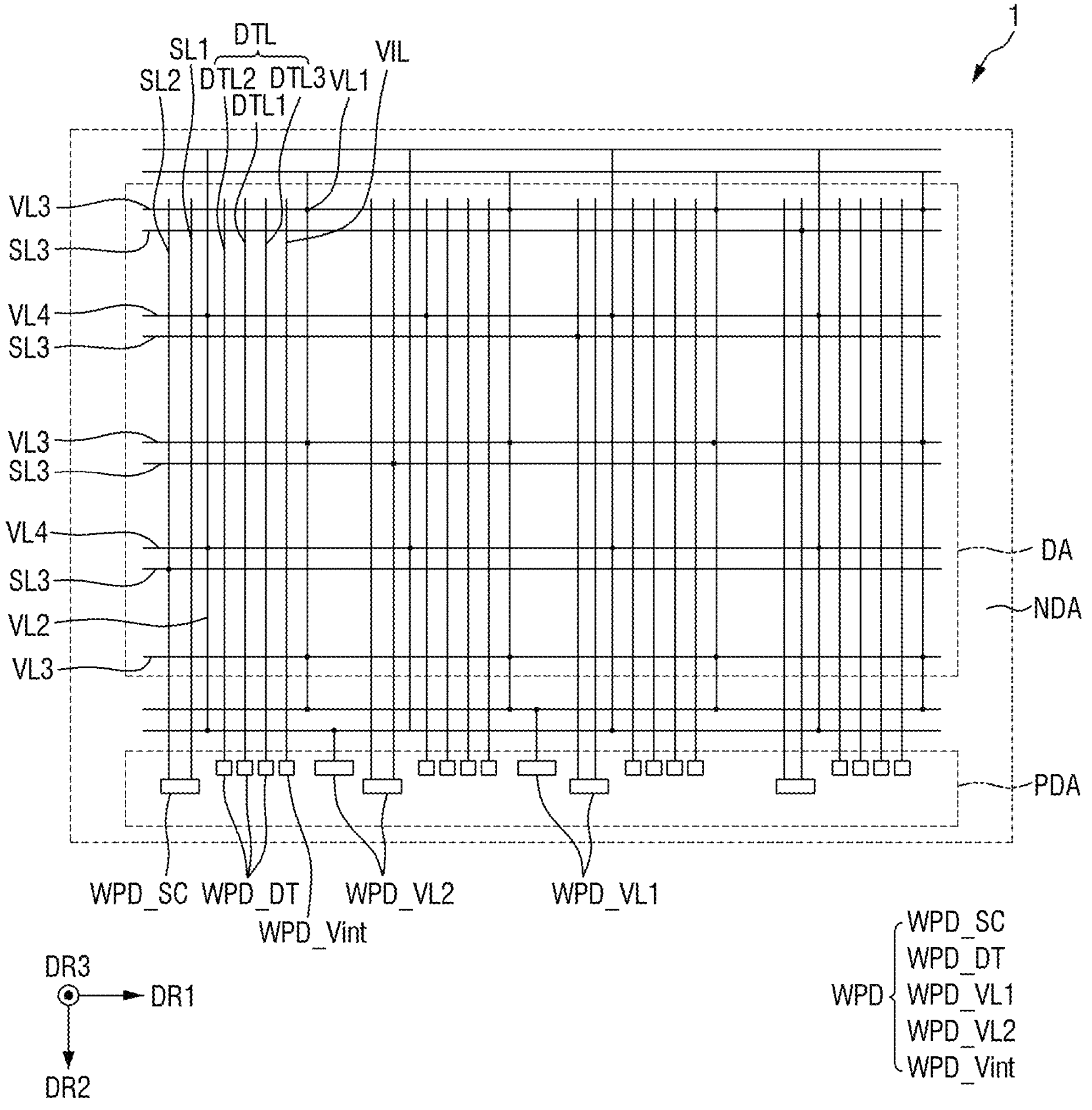
FIG. 2 is a view schematically showing arrangements of lines in a display device according to an embodiment of the disclosure.

FIG. 2 is a view schematically showing arrangements of lines in a display device according to an embodiment of the disclosure.

Referring to FIG. 2, the display device 1 may include lines. The display device 1 may include scan lines SL: SL1, SL2 and SL3, data lines DTL; DTL1, DTL2 and DTL3, an initialization voltage line VIL, voltage lines VL; VL1, VL2, VL3 and VL4 or a combination thereof. Although not shown in the drawings, other lines may be further disposed in the display device 1. The lines may include lines that may be part of a first conductive layer and extend in the first direction DR1, and lines that may be part of a third conductive layer and extend in the second direction DR2. It is, however, to be understood that the lines may extend in other directions.

The first scan line SL1 and the second scan line SL2 may extend in the second direction DR2. The first scan line SL1 and the second scan line SL2 may be disposed adjacent to each other, and may be spaced apart from other first and second scan lines SL1 and SL2 in the first direction DR1. The first scan line SL1 and the second scan line SL2 may be electrically connected to a scan wire pad WPD_SC which in turn are electrically connected to a scan driver (not shown). The first scan line SL1 and the second scan line SL2 may extend from a pad area PDA located in the non-display area NDA to the display area DA.

The third scan line SL3 may extend in the first direction DR1, and may be spaced apart from another third scan line SL3 in the second direction DR2. One third scan line SL3 may be electrically connected to one or more first scan lines SL1 or one or more second scan lines SL2. The scan lines SL may have, but is not limited to, a mesh structure on the entire surface of the display area DA.

The data lines DTL may extend in the second direction DR2. The data lines DTL may include a first data line DTL1, a second data line DTL2 and a third data line DTL3. The first to third data lines DTL1, DTL2 and DTL3 may be disposed adjacent to one another as a group. The data lines DTL1, DTL2 and DTL3 may extend from the pad area PDA located in the non-display area NDA to the display area DA. It should be understood, however, that the disclosure is not limited thereto. The data lines DTL may be equally spaced apart from one another by a first voltage line VL1 and a second voltage line VL2 to be described later.

The initialization voltage line VIL may extend in the second direction DR2. The initialization voltage line VIL may be disposed between the data lines DTL and the first voltage line VL1. The initialization voltage line VIL may extend from the pad area PDA located in the non-display area NDA to the display area DA.

The first voltage line VL1 and the second voltage line VL2 may extend in the second direction DR2, and the third voltage line VL3 and the fourth voltage line VL4 may extend in the first direction DR1. The first voltage line VL1 and the second voltage line VL2 may be arranged alternately in the first direction DR1, and the third voltage line VL3 and the fourth voltage line VL4 may be arranged alternately in the second direction DR2. The first voltage lines VL1 and the second voltage lines VL2 may extend in the second direction DR2 and may traverse the display area DA. Some of the third voltage line VL3 and the fourth voltage lines VL4 may be disposed in the display area DA while the others may be disposed in the non-display area NDA located external to opposing peripheral edges of the display area DA in the second direction DR2. The first voltage line VL1 and the second voltage line VL2 may be formed from a third conductive layer, and the third voltage line VL3 and the fourth voltage line VL4 may be formed from another conductive layer different from the third conductive layer. The first voltage line VL1 may be electrically connected to at least one third voltage line VL3, and the second voltage line VL2 may be electrically connected to at least one fourth voltage line VL4. The voltage lines VL may have a mesh structure in the entire display area DA. It is, however, to be understood that the disclosure is not limited thereto.

The first scan lines SL1, the second scan lines SL2, the data lines DTL, the initialization voltage line VIL, the first voltage lines VL1 and the second voltage lines VL2 may be electrically connected to one or more wire pads WPD. The wire pads WPD may be disposed in the non-display areas NDA. According to the embodiment of the disclosure, the wire pads WPD may be disposed in fourth area 194 of the non-display area NDA located external to a lower peripheral edge of the display area DA, i.e., the pad area PDA.

The first and second scan lines SL1 and SL2 may be electrically connected to the scan wire pad WPD_SC disposed in the pad area PDA, and the data lines DTL may be electrically connected to different data wire pads WPD_DT, respectively. The initialization voltage line VIL may be electrically connected to the initialization wiring pad WPD_Vint, the first voltage line VL1 may be electrically connected to a first voltage wire pad WPD_VL1, and the second voltage line VL2 may be electrically connected to the second voltage wire pad WPD_VL2. A flexible printed circuit board COF (see FIG. 8) may be mounted on the wire pads WPD as an external device. The external device, e.g., a flexible printed circuit board COF may be mounted on the wire pads WPD by an anisotropic conductive film, ultrasonic bonding technique, etc. Although the wire pads WPD may be disposed in the pad area PDA located in fourth area 194 of the non-display area NDA in the drawings, the disclosure is not limited thereto. Some of the wire pads WPD may be disposed in portions of the non-display area NDA external to an upper peripheral edge or external to one of the left and right peripheral edges of the display area DA.

Each of the pixels PX or sub-pixels SPXn of the display device 1 includes a pixel driving circuit, where n is an integer of 1 to 3. The above-described lines may pass through each of the pixels PX or a periphery thereof to apply a driving signal to the pixel driving circuit. The pixel driving circuit may include a transistor and a capacitor. The numbers of transistors and capacitors of each pixel driving circuit may be changed in a variety of ways. According to an embodiment of the disclosure, each of the sub-pixels SPXn of the display device 1 may have a 3T1C structure, i.e., a pixel driving circuit that includes three transistors and one capacitor. In the following description, the pixel driving circuit having the 3T1C structure will be described as an example. It is, however, to be understood that the disclosure is not limited thereto. A variety of modified structure may instead be employed such as a 2T1C structure, a 7T1C structure and a 6T1C structure.

Figure 3:
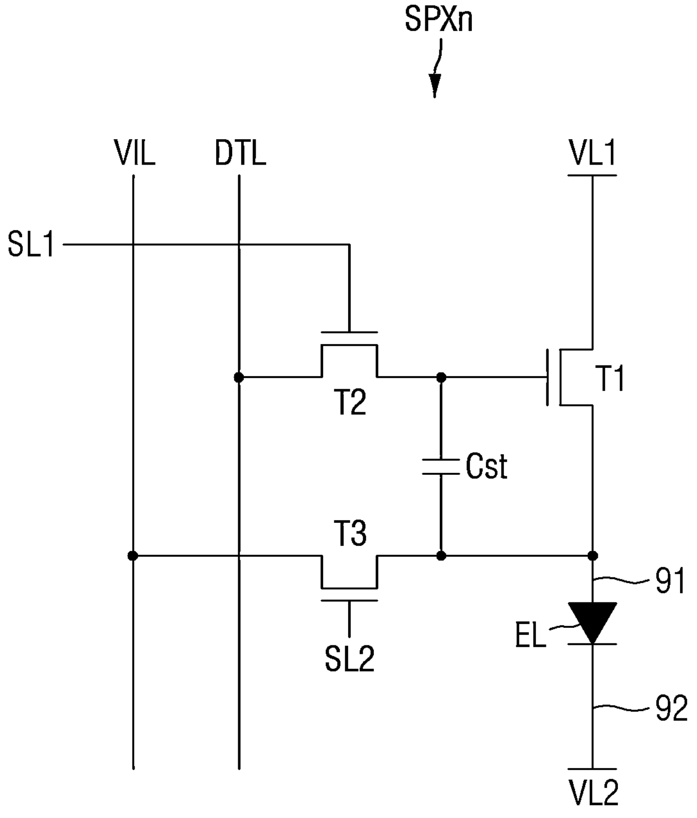
FIG. 3 is schematic diagram of an equivalent circuit of a sub-pixel according to an embodiment of the disclosure.

FIG. 3 is schematic diagram of an equivalent circuit of a sub-pixel according to an embodiment of the disclosure.

Referring to FIG. 3, each of the sub-pixels SPXn of the display device 1 according to an embodiment includes three transistors T1, T2 and T3, one storage capacitor Cst, and a light-emitting diode EL.

The light-emitting diode EL emits light in proportional to the current supplied through the first transistor T1. The light-emitting diode EL may include a first electrode, a second electrode, at least one light-emitting element disposed therebetween, or a combination thereof. The light-emitting element may emit light having a particular wavelength range in response to an electric signal transmitted from the first electrode to the second electrode.

A first end 91 of the light-emitting diode EL may be electrically connected to a source electrode of the first transistor T1, and a second end 92 thereof may be electrically connected to a second voltage line VL2 from which a low-level voltage (hereinafter referred to as a second supply voltage) lower than a high-level voltage (hereinafter referred to as a first supply voltage) of a first voltage line VL1 is applied.

The first transistor T1 adjusts a current flowing from the first voltage line VL1 from which the first supply voltage is supplied to the light-emitting diode EL according to the voltage difference between a gate electrode and the source electrode. For example, the first transistor T1 may be a driving transistor for driving the light-emitting diode EL. The gate electrode of the first transistor T1 may be electrically connected to a source electrode of the second transistor T2, the source electrode of the first transistor T1 may be electrically connected to the first electrode of the light-emitting diode EL, and the drain electrode of the first transistor T1 may be electrically connected to the first voltage line VL1 from which the first supply voltage is applied.

The second transistor T2 is turned on by a scan signal of the scan line SL and serves to electrically connect the data line DTL to the gate electrode of the first transistor T1. The gate electrode of the second transistor T2 may be electrically connected to the scan line SL, the source electrode thereof may be electrically connected to the gate electrode G1 of the first transistor T1, and the drain electrode thereof may be electrically connected to the data line DTL.

The third transistor T3 may be turned on by a scan signal of the scan line SL to electrically connect the initialization voltage line VIL to an end of the light-emitting diode EL. The gate electrode of the third transistor T3 may be electrically connected to the scan line SL, the drain electrode thereof may be electrically connected to the initialization voltage line VIL, and the source electrode thereof may be electrically connected to an end of the light-emitting diode EL or the source electrode of the first transistor T1.

The source electrode and the drain electrode of each of the transistors T1, T2 and T3 may not be limited to those described above. They may be electrically connected in the opposite way. Each of the transistors T1, T2 and T3 may be formed as a thin-film transistor. Although each of the transistors T1, T2 and T3 may be implemented as an n-type MOSFET (metal oxide semiconductor field effect transistor) in the example shown in FIG. 3, however the disclosure is not limited thereto. For example, each of the transistors T1, T2 and T3 may be implemented as a p-type MOSFET, or some of the transistors T1, T2 and T3 may be implemented as n-type MOSFETs while the others may be implemented as p-type MOSFETs.

The storage capacitor Cst is formed between the gate electrode and the source electrode of the first transistor T1. The storage capacitor Cst stores a voltage difference between the gate voltage and the source voltage of the first transistor T1.

According to the embodiment of FIG. 3, the gate electrode of the second transistor T2 may be electrically connected to the scan line SL1, and the gate electrode of the third transistor T3 may be electrically connected to the scan line SL2. In other words, the second transistor T2 and the third transistor T3 may be turned on by the scan signal applied from different scanlines. It should be understood, however, that the disclosure is not limited thereto. The second transistor T2 and the third transistor T3 may instead be electrically connected to a same scan line and may be turned on in response to scan signals applied from the same scan line.

Hereinafter, the structure of a pixel PX of the display device 1 according to the embodiment of the disclosure will be described.

Figure 4:
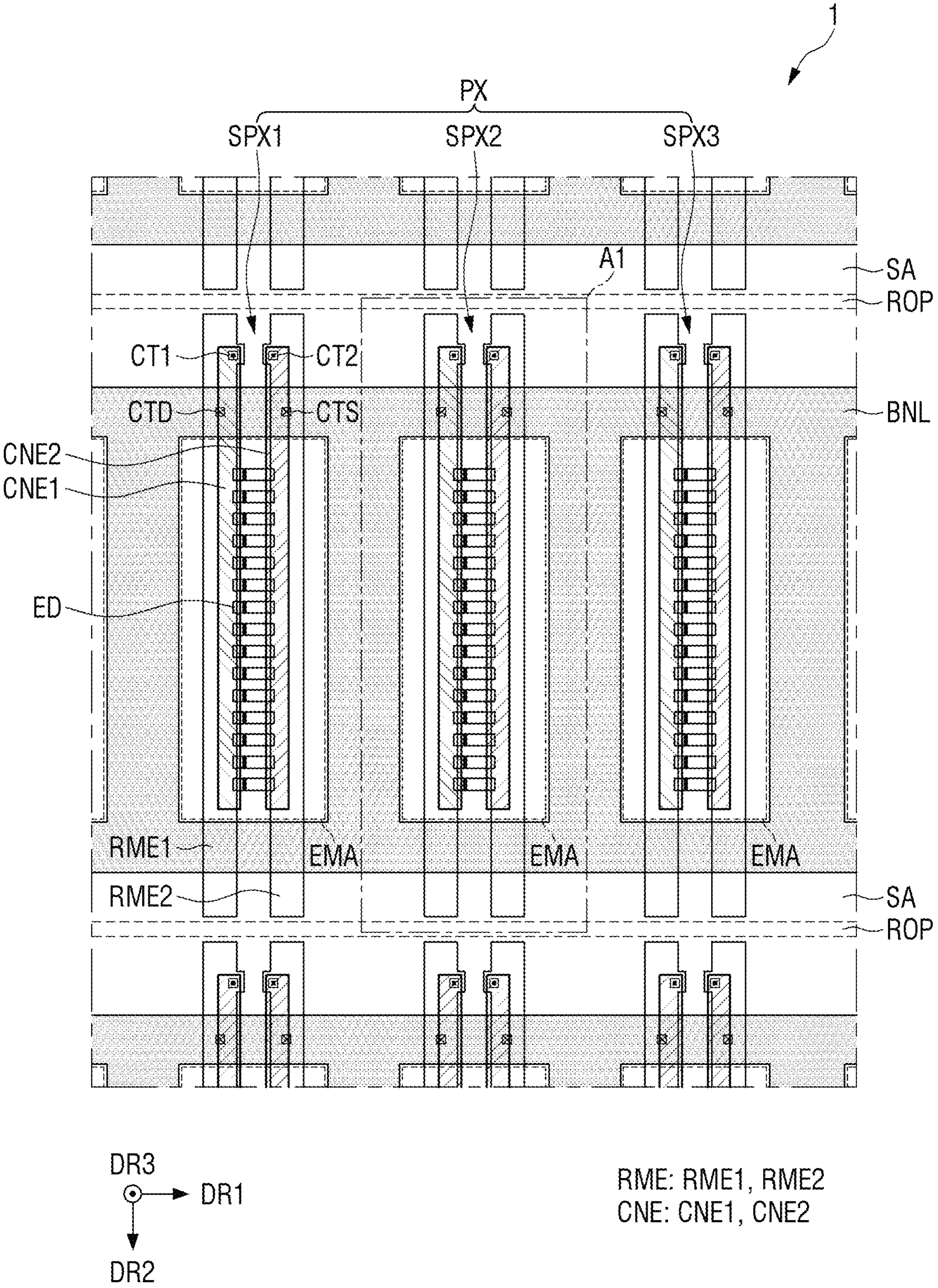
FIG. 4 is a plan view showing a structure of a pixel of a display device according to an embodiment of the disclosure.
Figure 5:
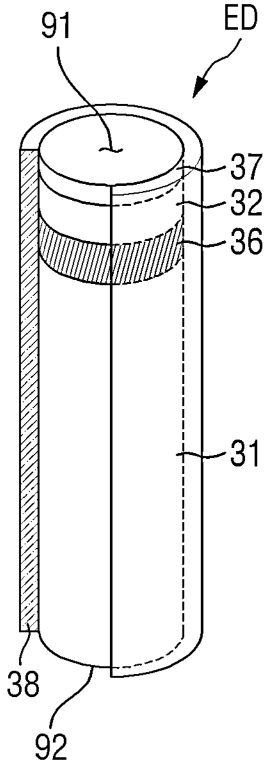
FIG. 5 is a perspective view showing the structure of one of the light-emitting elements of FIG. 4.
Figure 6:
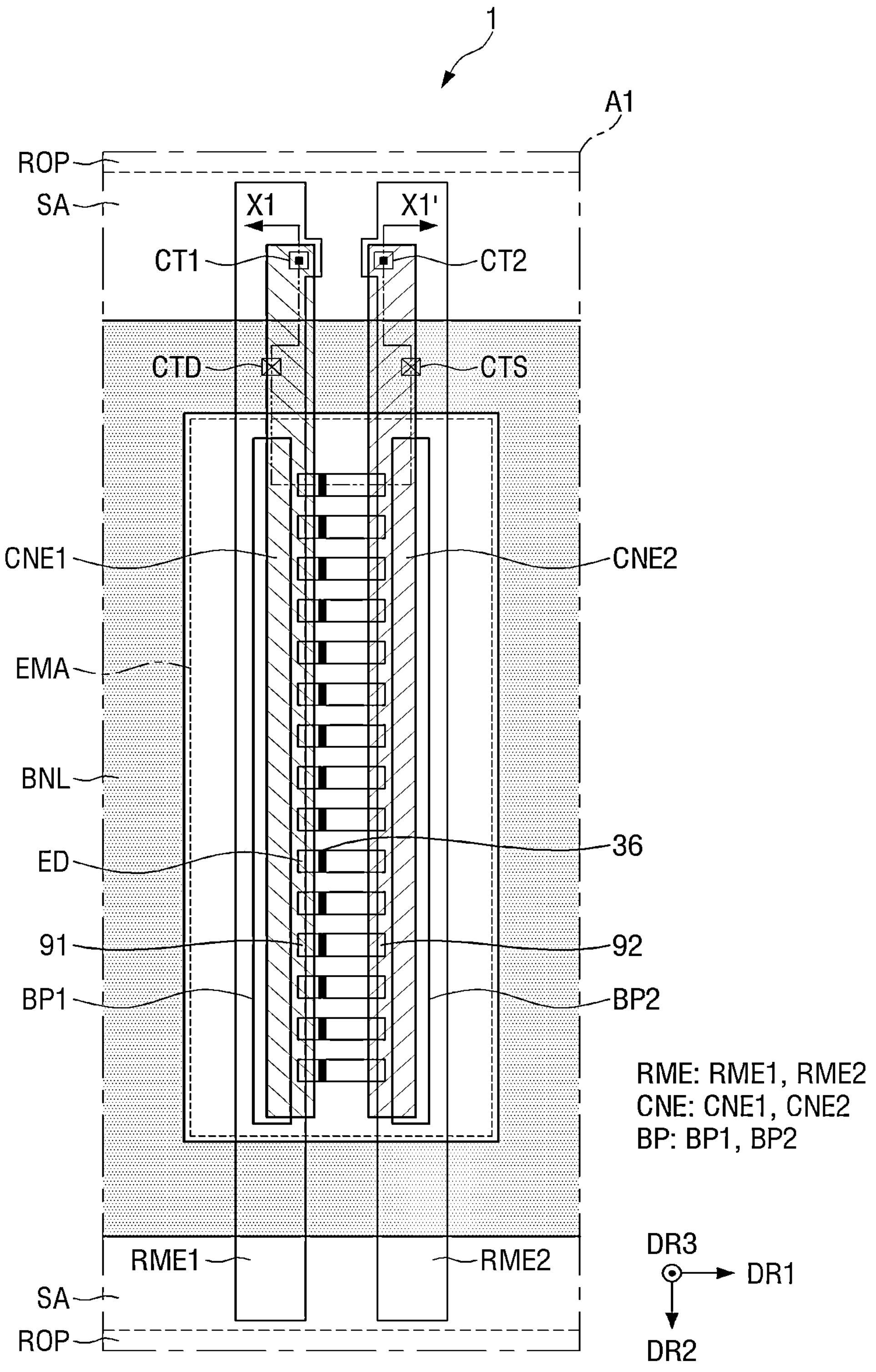
FIG. 6 is an enlarged view of area A1 of FIG. 4.

FIG. 4 is a plan view showing a structure of a pixel PX of a display device according to an embodiment of the disclosure. FIG. 5 is a perspective view showing the structure of one of the light-emitting elements ED of FIG. 4. FIG. 6 is an enlarged view of area A1 of FIG. 4 focusing on a single sub-pixel SPXn.

Referring to FIGS. 4 and 6, each of the pixels PX of the display device 1 may include sub-pixels SPXn. For example, a pixel PX may include a first sub-pixel SPX1, a second sub-pixel SPX2 and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. It is, however, to be understood that the disclosure is not limited thereto. All the sub-pixels SPXn may instead emit light of a same color. According to an embodiment of the disclosure, the sub-pixels SPXn may emit blue light. Although the single pixel PX includes three sub-pixels SPXn in the example shown in the drawings, the disclosure is not limited thereto. The pixel PX may include more than three sub-pixels SPXn. In the following description, it is assumed that a pixel PX includes three sub-pixels SPXn for convenience of illustration.

The first sub-pixel SPX1, the second sub-pixel SPX2 and the third sub-pixel SPX3 may be arranged sequentially in the first direction DR1. For example, the first sub-pixel SPX1 may be disposed on a side of the third sub-pixel SPX3 in the first direction DR1.

Accordingly, a pixel PX and at least one of the sub-pixels SPXn of the pixel PX may be adjacent to at least one of the sub-pixels SPXn of another adjacent pixel PX. For example, with reference to FIG. 4, the third sub-pixel SPX3 of the pixel PX illustrated may be adjacent to the first sub-pixel SPX1 of another pixel PX not illustrated but adjacent to the illustrated pixel PX on a side in the first direction DR1.

Each of the sub-pixels SPXn of the display device 1 may include an emission area EMA and a non-emission area. In the emission area EMA, light-emitting elements ED may be disposed to emit light of a particular wavelength band. In the non-emission area, the light-emitting elements ED may not be disposed and the light emitted from the light-emitting diodes ED do not reach, and thus no light exits therefrom.

The emission area EMA may be defined by an outer bank BNL. In other words, the emission area EMA may be the space surrounded by the outer bank BNL. In some embodiments, the emission area EMA may have, but is not limited to, a rectangular shape having the shorter sides extending in the first direction DR1 and the longer sides extending in the second direction DR2.

The emission area EMA may include an area in which the light-emitting elements ED may be disposed, and may include an area adjacent to the light-emitting elements ED where light emitted from the light-emitting elements ED exit. For example, the emission area EMA may also include an area in which light emitted from the light-emitting elements ED may be reflected or refracted by other elements to exit. The light-emitting elements ED may be disposed in each of the sub-pixels SPXn, and the emission area EMA may include the area where the light-emitting elements may be disposed and an adjacent area.

Although the emission areas EMA of the sub-pixels SPXn have the uniform area in the example shown in the drawings, the disclosure is not limited thereto. In some embodiments, the emission areas EMA of the sub-pixels SPXn may have different areas depending on a color or wavelength band of light emitted from the light-emitting diodes ED disposed in the respective sub-pixels SPXn.

Each of the sub-pixels SPXn may further include a subsidiary area SA disposed in the non-emission area. The subsidiary area SA may be separated depending on the arrangement of the alignment electrodes RME. The subsidiary area SA may be disposed on a side and another and opposing side of the emission area EMA that may be spaced-apart from each other in the second direction DR2. The emission areas EMA may be arranged alternately in the first direction DR1, and the subsidiary area SA may extend in the first direction DR1. The emission areas EMA and the subsidiary areas SA may be arranged repeatedly in the second direction DR2. Each of the emission areas EMA may be disposed between the subsidiary areas SA.

The subsidiary areas SA may be shared by sub-pixels SPXn adjacent to each other in the first direction DR1. For example, the first sub-pixel SPX1, the second sub-pixel SPX2 and the third sub-pixel SPX3 may share the subsidiary areas SA. The subsidiary areas SA may be shared by sub-pixels SPXn adjacent to each other in the second direction DR2. For example, the subsidiary areas SA disposed on opposing sides of the outer bank BNL in the second direction DR2 shown in FIG. 4 may be shared by the sub-pixels SPXn shown in the drawing and sub-pixels adjacent thereto in the second direction DR2 (not shown).

No light-emitting element ED is disposed in the subsidiary areas SA and thus no light exits therefrom. The alignment electrodes RME disposed in the sub-pixels SPXn may be partially disposed in the subsidiary areas SA. The alignment electrodes RME disposed in different sub-pixels SPXn may be spaced-apart from one another at separation regions ROP of the subsidiary areas SA.

The alignment electrodes RME and the connection electrodes CNE may be disposed in each sub-pixel SPXn in a shape that extends in the second direction DR2.

The alignment electrodes RME may include first alignment electrodes RME1 and second alignment electrodes RME2 sequentially arranged in the first direction DR1 in every sub-pixel SPXn. The first alignment electrodes RME1 and the second alignment electrodes RME2 may be spaced apart from one another in the first direction DR1.

The first alignment electrode RME1 may be disposed on the opposite side of the emission area EMA in the first direction DR1. For example, the first alignment electrode RME1 may be spaced apart in the first direction DR1 from a part of the outer bank BNL forming the opposite side of the emission area EMA in the first direction DR1.

The first alignment electrode RME1 may have a shape that extends in the second direction DR2. In some embodiments, the first alignment electrode RME1 may have, but is not limited to, a rectangular profile when viewed from the top. It should be understood, however, that the disclosure is not limited thereto. In the example shown in FIGS. 4 and 6, the first alignment electrode RME1 has a rectangular profile when viewed from the top.

The first alignment electrode RME1 may be electrically connected to a circuit element layer CCL (see FIG. 7) to be described later through a first electrode contact hole CTD. The first alignment electrode RME1 may receive the above-described first supply voltage through the first electrode contact hole CTD.

The second alignment electrode RME2 may be disposed on a side of the first alignment electrode RME1 in the first direction DR1. The second alignment electrode RME2 may be disposed on the opposite side of the emission area EMA than the first alignment electrode RME1 and be spaced-apart from the first alignment electrode RME1 in the first direction DR1. The second alignment electrode RME2 may also be spaced apart from a part of the outer bank BNL forming a side of the emission area EMA in the first direction DR1.

The second alignment electrode RME2 may have a shape that extends in the second direction DR2. In some embodiments, the second alignment electrode RME2 may have, but is not limited to, a rectangular profile when viewed from the top. It should be understood, however, that the disclosure is not limited thereto. In the example shown in FIGS. 4 and 6, the second alignment electrode RME2 has a rectangular profile when viewed from the top.

The second alignment electrode RME2 may be electrically connected to the circuit element layer CCL (see FIG. 7) to be described later through a second electrode contact hole CTS. The second alignment electrode RME2 may receive the above-described second supply voltage through the second electrode contact hole CTS.

The first electrode contact hole CTD and the second electrode contact hole CTS may not overlap the emission area EMA. In some embodiments, the first electrode contact hole CTD and the second electrode contact hole CTS may overlap the outer bank BNL. It should be understood, however, that the disclosure is not limited thereto. For example, the first electrode contact hole CTD and the second electrode contact hole CTS may be located on in the subsidiary area SA. In the example shown in FIGS. 4 and 6, the first electrode contact hole CTD and the second electrode contact hole CTS overlap the outer bank BNL.

Inner banks BP may be disposed under the alignment electrodes RME. The inner banks BP may be disposed in the emission area EMA of the sub-pixel SPXn. Each of the inner banks BP may include a first inner bank BP1 and a second inner bank BP2 each having a rectangular shape that extends in the second direction DR2 when viewed from the top. The first inner bank BP1 and the second inner bank BP2 may be spaced apart from each other in the first direction DR1.

The first inner bank BP1 may be disposed under the first alignment electrode RME1 in the emission area EMA, and the second inner bank BP2 may be disposed under the second alignment electrode RME2 in the emission area EMA.

In some embodiments, the alignment electrodes RME may completely cover the inner banks BP. It should be understood, however, that the disclosure is not limited thereto. For example, the alignment electrodes RME may instead only partially cover the inner banks BP. In the example shown in FIG. 6, the alignment electrodes RME completely cover the inner banks BP. Incidentally, the alignment electrodes RME may be spaced apart from one another in the first direction DR1 to provide a space in which the light-emitting elements ED may be disposed. For example, the light-emitting elements ED may be disposed on the space between the first alignment electrode RME1 and the second alignment electrode RME2.

Referring to FIG. 5, the light-emitting element ED may have a size from nanometers to micrometers and may be an inorganic light-emitting diode that includes an inorganic material. The light-emitting element ED may be aligned between two electrodes facing each other as polarities may be created by forming an electric field in a particular direction between the two electrodes.

The light-emitting element ED according to an embodiment may have a shape that extends in a direction. The light-emitting element ED may have a shape of a cylinder, a rod, a wire, a tube, etc. It is to be understood that the shape of the light-emitting element ED is not limited thereto. The light-emitting element ED may have a variety of shapes including a polygonal column shape such as a cube, a cuboid and a hexagonal column, or a shape that is extended in a direction with partially inclined outer surfaces.

The light-emitting element ED may include semiconductor layers doped with a dopant of a conductive type (e.g., p-type or n-type). The semiconductor layers may emit light of a certain wavelength band by transmitting an electric signal applied from an external power source. The light-emitting element ED may include a first semiconductor layer 31, a second semiconductor layer 32, an emissive layer 36, an electrode layer 37, an insulating film 38, or a combination thereof.

The first semiconductor layer 31 may be an n-type semiconductor. The first semiconductor layer 31 may include a semiconductor material having the following chemical formula: $Al_xGa_yIn_{1-x-y}N$ ($0 \le x \le 1$, $0 \le y \le 1$, $0 \le x+y \le 1$). For example, the first semiconductor layer 31 may be one or more of AlGaInN, GaN, AlGaN, InGaN, AlN and InN doped with n-type dopant. The n-type dopant doped into the first semiconductor layer 31 may be Si, Ge, Sn, Se, etc.

The second semiconductor layer 32 is disposed above the first semiconductor layer 31 with the emissive layer 36 therebetween. The second semiconductor layer 32 may be a p-type semiconductor, and may include a semiconductor material having the following chemical formula: $Al_xGa_yIn_{1-x-y}N$ ($0 \le x \le 1$, $0 \le y \le 1$, $0 \le x+y \le 1$). For example, the second semiconductor layer 32 may be one or more of AlGaInN, GaN, AlGaN, InGaN, AlN and InN doped with p-type dopant. The p-type dopant doped into the second semiconductor layer 32 may be Mg, Zn, Ca, Ba, etc.

Accordingly, opposing ends of the light-emitting element ED may have different polarities. In the following description, an end of the light-emitting element ED that is adjacent to the second semiconductor layer 32 will be referred to as a first end 91, while another end adjacent to the first semiconductor layer 31 will be referred to as a second end 92 for convenience of illustration. The first end 91 of the light-emitting element ED may be located opposite to the second end 92.

The first end 91 and the second end 92 of the light-emitting element ED may have different polarities. The first ends 91 of different light-emitting elements ED may have a same polarity, and the second ends 92 of different light-emitting elements ED may have a same polarity.

Although each of the first semiconductor layer 31 and the second semiconductor layer 32 is implemented as a single layer in the drawings, the disclosure is not limited thereto. Depending on the material of the emissive layer 36, the first semiconductor layer 31 and the second semiconductor layer 32 may include a larger number of layers, e.g., a clad layer or a tensile strain barrier reducing (TSBR) layer. For example, the light-emitting elements ED may further include another semiconductor layer disposed between the first semiconductor layer 31 and the emissive layer 36 or between the second semiconductor layer 32 and the emissive layer 36. The another semiconductor layer disposed between the first semiconductor layer 31 and the emissive layer 36 may be one or more of AlGaInN, GaN, AlGaN, InGaN, AlN, InN and SLs doped with an n-type dopant. The another semiconductor layer disposed between the second semiconductor layer 32 and the emissive layer 36 may be one or more of AlGaInN, GaN, AlGaN, InGaN, AlN, and InN doped with a p-type dopant.

The emissive layer 36 is disposed between the first semiconductor layer 31 and the second semiconductor layer 32. The emissive layer 36 may include a material having a single or multiple quantum well structure. When the emissive layer 36 includes a material having the multiple quantum well structure, the structure may include quantum layers and well layers alternately stacked on each other. The emissive layer 36 may emit light as electron-hole pairs may combined therein in response to an electrical signal applied through the first semiconductor layer 31 and the second semiconductor layer 32. The emissive layer 36 may include a material such as AlGaN, AlGaInN, InGaN, or a combination thereof. In case that the emissive layer 36 has a multi-quantum well structure in which quantum layers and well layers may be alternately stacked on each other, the quantum layers may include AlGaN, AlGaInN, or a combination thereof, and the well layers may include a material such as GaN and AlGaN.

The emissive layer 36 may have a structure in which a semiconductor material having a large band gap energy and a semiconductor material having a small band gap energy may be alternately stacked on each other, and may include other Group III to Group V semiconductor materials depending on the wavelength range of the emitted light. Accordingly, the light emitted from the emissive layer 36 is not limited to the light of the blue wavelength band. The emissive layer 36 may emit light of red or green wavelength band in some implementations.

The electrode layer 37 may be an ohmic connection electrode. It is, however, to be understood that the disclosure is not limited thereto. The electrode layer 37 may be a Schottky connection electrode. The light-emitting element ED may include at least one electrode layer 37. The light-emitting element ED may include one or more electrode layers 37. It is, however, to be understood that the disclosure is not limited thereto. The electrode layer 37 may be eliminated.

The electrode layer 37 can reduce a resistance between the light-emitting element ED and the electrodes or the connection electrodes in case the light-emitting element ED is electrically connected to the electrodes or the connection electrodes in the display device 1. The electrode layer 37 may include a metal having conductivity. For example, the electrode layer 37 may include at least one of aluminum (Al), titanium (Ti), indium (In), gold (Au), silver (Ag), ITO, IZO, and ITZO. With the above-described configuration, the both ends of each of the light-emitting elements ED may have different polarities.

The insulating film 38 is disposed to surround the outer surfaces of the semiconductor layers and electrode layers described above. For example, the insulating film 38 may be disposed to surround at least the outer surface of the emissive layer 36, with both ends of the light-emitting element ED in the longitudinal direction exposed. Apart of the upper surface of the insulating film 38 may be rounded in a schematic cross section, which is adjacent to at least one of the ends of the light-emitting element ED.

The insulating film 38 may include materials having insulating properties, for example, at least one of: silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), titanium oxide (TiOx). Although the insulating film 38 is formed as a single layer in the drawings, the disclosure is not limited thereto. In some embodiments, the insulating film 38 may include a multilayer structure in which multiple layers may be stacked on each other.

The insulating film 38 can protect the semiconductor layers and the electrode layer of the light-emitting elements ED. The insulating film 38 can prevent an electrical short-circuit that may occur in the emissive layer 36 if it comes in direct contact with an electrode through which an electric signal is transmitted to the light-emitting element ED. The insulating film 38 can also prevent a decrease in luminous efficiency.

The outer surface of the insulating film 38 may be subjected to a surface treatment. The light-emitting elements ED may be dispersed in an ink, and the ink may be sprayed onto the electrode. In doing so, a surface treatment may be applied to the insulating film 38 so that it becomes hydrophobic or hydrophilic in order to keep the light-emitting diodes ED dispersed in the ink from being aggregated with one another.

Referring back to FIGS. 4 and 6, light-emitting elements ED may be arranged in the second direction DR2 in the space between the first alignment electrode RME1 and the second alignment electrode RME2 in the emission area EMA of each of the sub-pixels SPXn.

In FIG. 6, each of the light-emitting elements ED has a black line. The black line of each of the light-emitting elements ED may be the emissive layer 36 shown in FIG. 5. An end of each of the light-emitting elements ED that is closer to the black line may be the above-described first end 91, whereas another and opposing end thereof may be the second end 92.

The light-emitting element ED may extend in the first direction DR1, and may be oriented such that the first end 91 is disposed on a side of the first alignment electrode RME1 in the first direction DR1, and the second end 92 is disposed on a facing side of the second alignment electrode RME2 in the first direction DR1.

The connection electrodes CNE may be disposed on the light-emitting elements ED. The connection electrodes CNE may include a first connection electrode CNE1 and a second connection electrode CNE2 that may be spaced apart from each other and sequentially arranged in the first direction DR1.

The first connection electrode CNE1 and the second connection electrode CNE2 may be spaced apart from each other in the first direction DR1. For example, the second connection electrode CNE2 may be disposed on a side of the first connection electrode CNE1 in the first direction DR1.

The first connection electrode CNE1 may be disposed on the first alignment electrode RME1 in the emission area EMA. The first connection electrode CNE1 may have a shape that generally extends in the second direction DR2 in the emission area EMA.

The first connection electrode CNE1 may be electrically connected to the first ends 91 of the light-emitting elements ED in the emission area EMA. For example, the first connection electrode CNE1 may extend in the second direction DR2 in the emission area EMA, and may be electrically connected to the first ends 91 of the light-emitting elements ED. The light-emitting elements ED being arranged in parallel in the second direction DR2 in the space between the first alignment electrode RME1 and the second alignment electrode RME2.

The first connection electrode CNE1 may be electrically connected to the first alignment electrode RME1 through a first contact location CT1 at a location that does not overlap the emission area EMA. Accordingly, the first connection electrode CNE1 may receive the above-described first supply voltage from the first alignment electrode RME1.

The second connection electrode CNE2 may be disposed on the second alignment electrode RME2 in the emission area EMA. The second connection electrode CNE2 may have a shape that generally extends in the second direction DR2 in the emission area EMA.

The second connection electrode CNE2 may be electrically connected to the second ends 92 of the light-emitting elements ED in the emission area EMA. For example, the second connection electrode CNE2 may extend in the second direction DR2 in the emission area EMA, and may be electrically connected to the second ends 92 of the light-emitting elements ED, the light-emitting elements ED being arranged in parallel in the second direction DR2 in the space between the first alignment electrode RME1 and the second alignment electrode RME2.

The second connection electrode CNE2 may be electrically connected to the second alignment electrode RME2 through a second contact location CT2 at a location that does not overlap the emission area EMA. Accordingly, the second connection electrode CNE2 may receive the above-described second supply voltage from the second alignment electrode RME2.

Hereinafter, the stack structure of the elements of the display device 1 according to the embodiment will be described.

Figure 7:
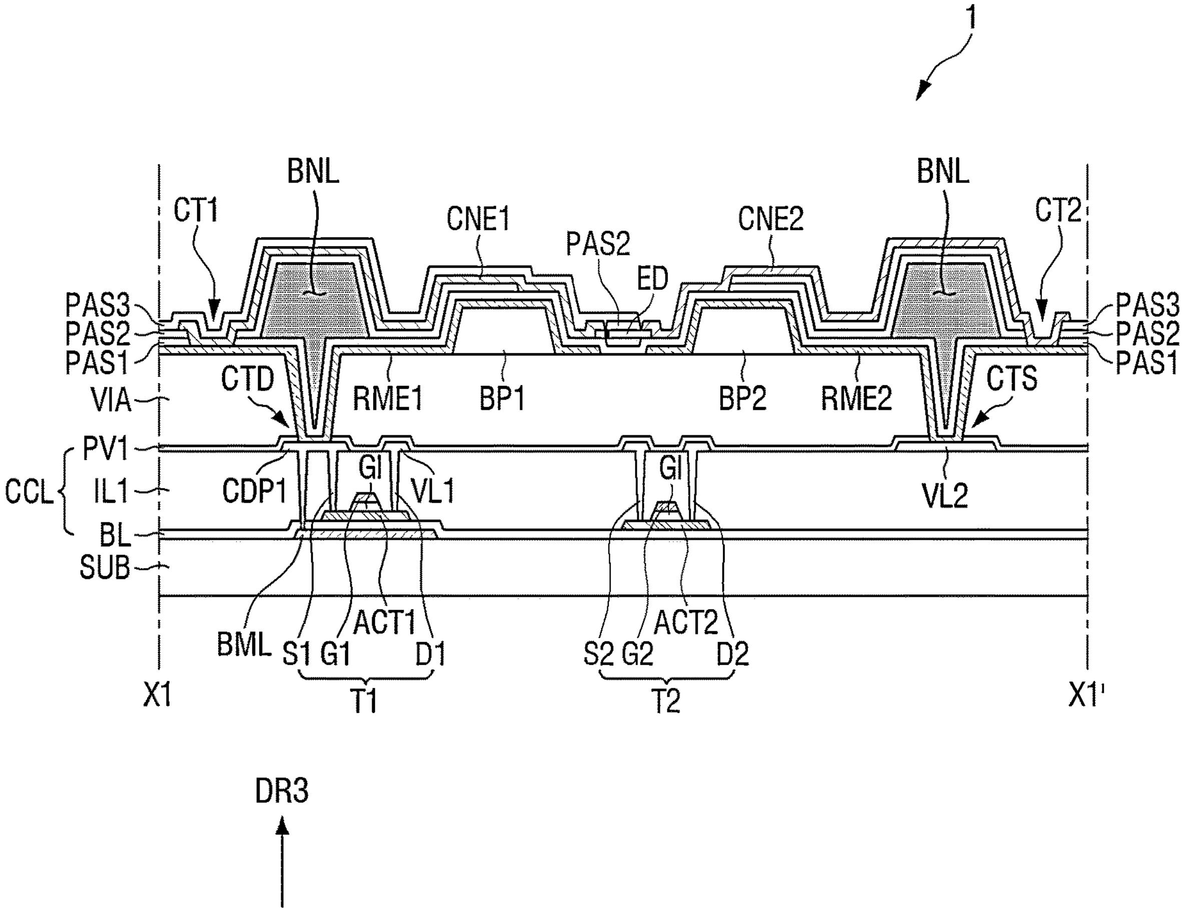
FIG. 7 is a schematic cross-sectional view taken along line X1-X1' of FIG. 6.

FIG. 7 is a schematic cross-sectional view taken along line X1-X1' of FIG. 6.

Referring to FIG. 7 in conjunction with FIG. 6, the schematic cross-sectional structure of the display device 1 will now be described. The display device 1 may include a substrate SUB, and a semiconductor layer, conductive layers, insulating layers, or a combination thereof disposed on the substrate SUB. The display device 1 may include alignment electrodes RME, light-emitting elements ED, connection electrodes CNE, or a combination thereof as described above. The semiconductor layer, the conductive layers and the insulating layers may form a circuit element layer CCL of the display device 1.

The substrate SUB may include an insulating material such as glass, quartz and a polymer resin. The substrate SUB may be either a rigid substrate or a flexible substrate that can be bent, folded, or rolled.

Figure 10:
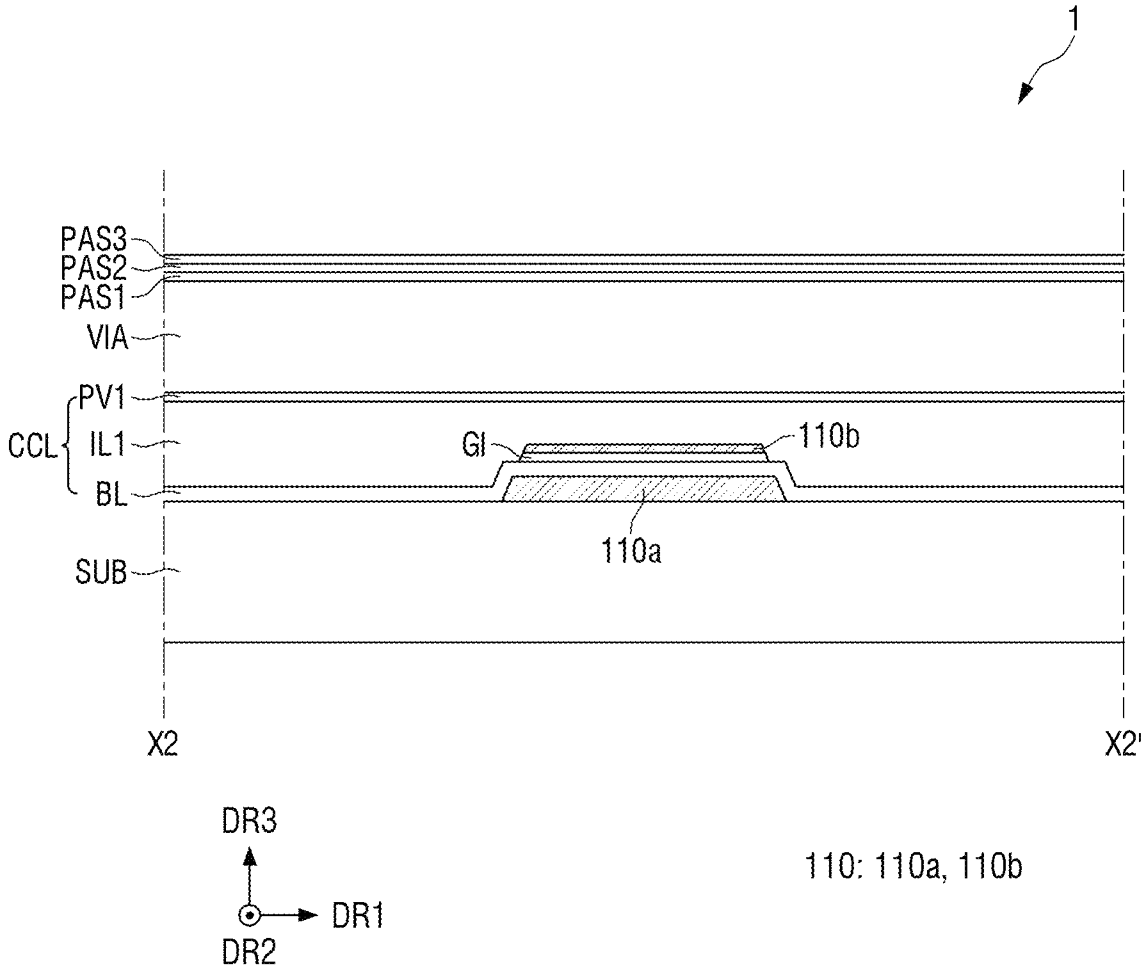
FIG. 10 is a schematic cross-sectional view taken along line X2-X2' of FIG. 9.
Figure 12:
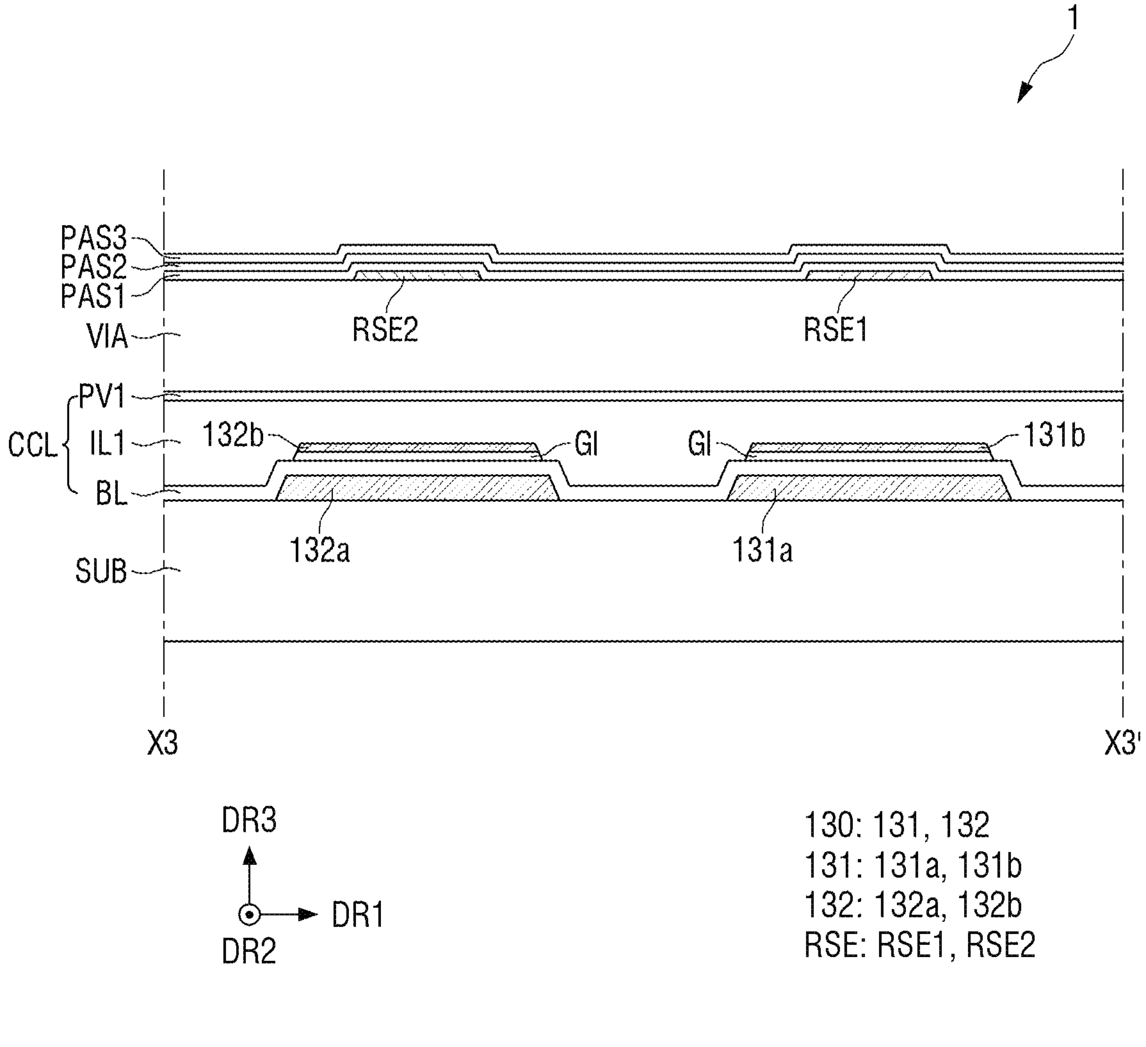
FIG. 12 is a schematic cross-sectional view taken along line X3-X3' of FIG. 11.

The circuit element layer CCL may be disposed on the substrate SUB. In the circuit element layer CCL, a variety of lines may be disposed, which transmit electrical signals to the light-emitting elements ED disposed on the substrate SUB. The circuit element layer CCL may be disposed in the display area DA and the non-display area NDA as shown in FIGS. 7, 10 and 12. Hereinafter, the structure of the circuit element layer CCL disposed in the display area DA will be described.

As shown in FIG. 7, the circuit element layer CCL may include a first conductive layer, a semiconductor layer, a second conductive layer, a third conductive layer, or a combination thereof as the conductive layers, and may include a buffer layer BL, a first gate insulator GI, a first interlayer dielectric layer IL1, a first protective layer PV1, or a combination thereof as the insulating layers.

The first conductive layer may be disposed on the upper surface of the substrate SUB and may be in direct contact with the upper surface of the substrate SUB. The first conductive layer includes a bottom metal layer BML. The bottom metal layer BML is disposed to overlap an active layer ACT1 of a first transistor T1. The bottom metal layer BML may prevent light from being incident on the first active layer ACT1 of the first transistor T1 or may be electrically connected to the first active layer ACT1 to stabilize the electrical characteristics of the first transistor T1.

The first conductive layer may include a metal. For example, in some embodiments, the first conductive layer may include molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu), or a combination thereof. In some embodiments, the first conductive layer may also include, but is not limited to, a pigment that can block light, such as carbon black. The first conductive layer may be eliminated in some implementations.

A buffer layer BL may be disposed on the bottom metal layer BML and the substrate SUB. The buffer layer BL may be formed on the substrate SUB to protect the transistors of the pixels PX from moisture permeating through the substrate SUB that is susceptible to moisture permeation, and may also provide a flat surface.

The semiconductor layer is disposed on the buffer layer BL. The semiconductor layer may include the first active layer ACT1 of the first transistor T1 and the second active layer ACT2 of the second transistor T2. The first active layer ACT1 and the second active layer ACT2 may be disposed to partially overlap the first gate electrode G1 and the second gate electrode G2 of a second conductive layer, respectively, which will be described later.

The semiconductor layer may include polycrystalline silicon, monocrystalline silicon, an oxide semiconductor, or a combination thereof, etc. In other embodiments, the semiconductor layer may include polycrystalline silicon. The oxide semiconductor may be an oxide semiconductor including indium (In). For example, the oxide semiconductor may include be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), indium-gallium zinc tin oxide (IGZTO), etc.

Although the first transistor T1 and the second transistor T2 may be disposed in the pixel PX of the display device 1 in the drawings, the disclosure is not limited thereto. A larger number of transistors may be included in the display device 1.

The first gate insulator GI is disposed on the semiconductor layer in the display area DA. The first gate insulator GI may serve as a gate insulating film of the transistors T1 and T2. In the example shown in the drawings, the first gate insulator GI is patterned together with the gate electrodes G1 and G2 of the second conductive layer to be described later, and is partially disposed between the second conductive layer and the active layers ACT1 and ACT2 of the semiconductor layer. It is, however, to be understood that the disclosure is not limited thereto. In some embodiments, the first gate insulator GI may be disposed entirely on the buffer layer BL.

The second conductive layer may be disposed on the first gate insulator GI and may be in contact with the upper surface of the first gate insulator GI. The second conductive layer may include the first gate electrode G1 of the first transistor T1, the second gate electrode G2 of the second transistor T2, or a combination thereof. The first gate electrode G1 may overlap a channel region of the first active layer ACT1 in the third direction DR3, which is the thickness direction. The second gate electrode G2 may overlap a channel region of the second active layer ACT2 in the third direction DR3.

The second conductive layer may include a metal. For example, in some embodiments, the second conductive layer may include, but is not limited to, at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu).

A first interlayer dielectric layer IL1 may be disposed on the second conductive layer. The first interlayer dielectric layer IL1 may work as an insulating film between the second conductive layer and other layers disposed thereon and can protect the second conductive layer.

The third conductive layer is disposed on the first interlayer dielectric layer ILL. The third conductive layer may include the first voltage line VL1 and the second voltage line VL2 disposed in the display area DA, a first conductive pattern CDP1, the source electrodes S1 and S2 and drain electrodes D1 and D2 of the transistors T1 and T2 respectively, or a combination thereof.

A high-level voltage (or a first supply voltage) may be applied to the first voltage line VL1 to be transmitted to the first alignment electrode RME1, and a low-level voltage (or a second supply voltage) may be applied to the second voltage line VL2 to be transmitted to the second alignment electrode RME2. A part of the first voltage line VL1 may be electrically connected with the first active layer ACT1 of the first transistor T1 through a contact hole that penetrates the first interlayer dielectric layer IL1. The first voltage line VL1 may serve as the first drain electrode D1 of the first transistor T1. The first voltage line VL1 may be connected (e.g., electrically connected) to the first alignment electrode RME1 when first transistor T1 is turned on, and the second voltage line VL2 may be connected (e.g., directly connected) to the second alignment electrode RME2.

The first conductive pattern CDP1 may be electrically connected with the first active layer ACT1 of the first transistor T1 through a contact hole that penetrates the first interlayer dielectric layer IL1. The first conductive pattern CDP1 may be electrically connected with the bottom metal layer BML through another contact hole that penetrates the first interlayer dielectric layer IL1 and the buffer layer BL. The first conductive pattern CDP1 may serve as a first source electrode S1 of the first transistor T1. The first conductive pattern CDP1 may be electrically connected to a first electrode RME1 or a first connection electrode CNE1 to be described later. The first transistor T1 may transfer the first supply voltage applied from the first voltage line VL1 to the first electrode RME1 or the first connection electrode CNE1.

Each of the second source electrode S2 and the second drain electrode D2 may be electrically connected with the second active layer ACT2 of the second transistor T2 through contact holes that penetrates the first interlayer dielectric layer IL1.

The third conductive layer may include a metal. In some embodiments, the third conductive layer may include molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu), or a combination thereof.

A first protective layer PV1 is disposed over the third conductive layer. The first protective layer PV1 may work as an insulating film between the third conductive layer and other layers and can protect the third conductive layer.

The buffer layer BL, the first gate insulating layer GI, the first interlayer dielectric layer IL1 and the first protective layer PV1 may include multiple inorganic layers stacked on each other alternately. For example, the buffer layer BL, the first gate insulating layer GI, the first interlayer dielectric layer IL1 and the first protective layer PV1 may include a double layer in which inorganic layers including at least one of silicon oxide (SiOx), silicon nitride (SiNx), and silicon oxynitride (SiON) may be stacked on each other or multiple layers in which they may be alternately stacked each other.

The via insulating layer VIA may be disposed on the circuit element layer CCL. Specifically, the via insulating layer VIA may be disposed on the first protective layer PV1 of the circuit element layer CCL. The via insulating layer VIA may include an organic insulating material, e.g., an organic insulating material such as polyimide, to provide a flat surface over a variety of lines having different heights in the circuit element layer CCL.

The inner banks BP may be disposed on the upper surface of the via insulating layer VIA. In other words, the via insulating layer VIA and the inner banks BP may be in direct contact with each other.

The inner banks BP may be disposed on the via insulating layer VIA. The inner banks BP may have inclined side surfaces or bent side surfaces with a certain curvature. The light emitted from the light-emitting elements ED may be reflected by the alignment electrodes RME disposed on the inner banks BP so that the light may exit toward a side in the third direction DR3. The inner banks BP may include, but is not limited to, an organic insulating material including a transparent material such as polyimide. Also, the inner banks BP may further include a colored dye such as a black pigment.

The alignment electrodes RME may be disposed on the via insulating layer VIA and on the inner banks BP. The first alignment electrode RME1 may be disposed on the via insulating layer VIA to overlap the first inner bank BP1 in the third direction DR3, and may extend toward the second inner bank BP2. The second alignment electrode RME2 may be disposed on the via insulating layer VIA to overlap the second inner bank BP2 in the third direction DR3, and may extend toward the first inner bank BP1.

The distance between the first and second alignment electrodes RME1 and RME2 may be smaller than the distance between the first and second inner banks BP1 and BP2.

The first alignment electrode RME1 may be electrically connected to the first conductive pattern CDP1 through the first electrode contact hole CTD that penetrates through the via insulating layer VIA and the first protective layer PV1. The second alignment electrode RME2 may be electrically connected to the second voltage line VL2 through the second electrode contact hole CTS that penetrates through the via insulating layer VIA and the first protective layer PV1.

The alignment electrodes RME may include a conductive material having a high reflectance. For example, the alignment electrodes RME may include a metal such as silver (Ag), copper (Cu) and aluminum (Al), or may include an alloy including aluminum (Al), nickel (Ni), lanthanum (La), or the like, or a stack of a metal layer such as titanium (Ti), molybdenum (Mo), niobium (Nb), a combination thereof or an alloy thereof.

In some embodiments, the alignment electrodes RME may be made up of a double- or multi-layer in which an alloy including aluminum (Al) and at least one metal layer including titanium (Ti), molybdenum (Mo) and niobium (Nb) may be stacked on each other.

It is, however, to be understood that the disclosure is not limited thereto. The alignment electrodes RME may further include a transparent conductive material. For example, each of the alignment electrodes RME may include a material such as ITO, IZO, ITZO, or a combination thereof. In some embodiments, each of the alignment electrodes RME1 and RME2 may have a structure in which one or more layers of a transparent conductive material and one or more metal layers having high reflectivity may be stacked on each other, or may include a single layer including them. For example, each of the alignment electrodes RME may have a stack structure such as ITO/Ag/ITO/, ITO/Ag/IZO, or ITO/Ag/ITZO/IZO. The alignment electrodes RME may be electrically connected to the light-emitting elements ED and may reflect some of the light emitted from the light-emitting elements ED and directed toward the upper side of the substrate SUB.

The first passivation layer PAS1 may be disposed on the front surface of the display area DA, and may be disposed on the alignment electrodes RME. The first passivation layer PAS1 may include an insulating material, and can protect the alignment electrodes RME and can insulate different alignment electrodes RME from one another. As the first passivation layer PAS1 is disposed to cover the alignment electrodes RME before the outer bank BNL is formed, and thus it is possible to prevent the alignment electrodes RME from being damaged during the process of forming the outer bank BNL. The first passivation layer PAS1 can also prevent the light-emitting diodes ED disposed thereon from being brought into contact with other elements and causing damage.

In an embodiment, the first passivation layer PAS1 may have steps so that a part of the upper surface is recessed between the alignment electrodes RME that may be spaced apart from each other in the first direction DR1. The light-emitting diodes ED may be disposed at the steps of the upper surface of the first passivation layer PAS1, and space may be formed between the light-emitting diodes ED and the first passivation layer PAS1.

The first passivation layer PAS1 may include contact locations CT1 and CT2. The contacts may be located such that they overlap different alignment electrodes RME, respectively. For example, the contacts may include a first contact location CT1 overlapping the first alignment electrode RME1 and a second contact location CT2 overlapping the second alignment electrode RME2.

The first contact location CT1 and the second contact location CT2 may penetrate the first passivation layer PAS1 to expose a part of the upper surface of the first alignment electrode RME1 and the second alignment electrode RME2 disposed thereunder respectively. Each of the first contact location CT1 and the second contact location CT2 may further penetrate some of the other insulating layers disposed on the first passivation layer PAS1. The alignment electrodes RME exposed by the contacts may be electrically connected with the connection electrodes CNE. The light-emitting elements ED may be electrically connected with the connection electrodes CNE and may be electrically connected to the circuit element layer CCL under the alignment electrodes RME and the via insulating layer VIA, so that they can emit light in certain wavelength bands by receiving an electrical signal.

The outer bank BNL may be disposed on the first passivation layer PAS1. The outer bank BNL may include portions that extend in the first direction DR1 and the second direction DR2 and may surround each of the sub-pixels SPXn. The outer banks BNL may surround the sub-pixels SPXn to separate them from one another, and may surround the border of the display area DA to distinguish between the display area DA and the non-display area NDA.

The outer bank BNL may have a predetermined height similar to that of the inner banks BP. In some embodiments, the upper surface of the outer bank BNL may be higher than that of the inner banks BP, and the thickness thereof may be equal to or greater than that of the inner banks BP. Accordingly, the outer bank BNL can effectively prevent an ink from overflowing into adjacent sub-pixels SPXn during an inkjet printing process in the fabrication of the display device 1. The outer bank BNL may include, but is not limited to, an organic insulating material that includes a transparent material such as polyimide, like the inner banks BP. The outer bank BNL may also include a colored dye such as a black pigment.

The second passivation layer PAS2 may be disposed on the light-emitting elements ED, the first passivation layer PAS1 and the outer bank BNL. The second passivation layer PAS2 may extend in the first direction DR1 between the inner bank patterns BP and may include a pattern portion disposed on the light-emitting elements ED. The patterned portion may be disposed to partially surround the outer surface of the light-emitting diodes ED, and may not cover both sides or both ends of the light-emitting diodes ED. The patterned portion may form a linear or island pattern in each sub-pixel SPXn when viewed from the top. The patterned portion of the second passivation layer PAS2 can protect the light-emitting elements ED and can fix the light-emitting elements ED during the process of fabricating the display device 1. The second passivation layer PAS2 may be disposed to fill the space between light-emitting diodes ED and the first passivation layer PAS1 thereunder.

The second passivation layer PAS2 may include contact locations CT1 and CT2. The contacts may be located such that they overlap different alignment electrodes RME, respectively. For example, the contacts may include a first contact location CT1 overlapping the first alignment electrode RME1 and a second contact location CT2 overlapping the second alignment electrode RME2. The first contact location CT1 and the second contact location CT2 may penetrate the second passivation layer PAS2 to expose a part of the upper surface of the first alignment electrode RME1 and the second alignment electrode RME2 disposed thereunder respectively. Each of the first contact location CT1 and the second contact location CT2 may further penetrate some of the other insulating layers disposed on the second passivation layer PAS2. The alignment electrodes RME exposed by the contacts may be electrically connected with the connection electrodes CNE. The light-emitting elements ED may be electrically connected with the connection electrodes CNE and may be electrically connected to the circuit element layer CCL under the alignment electrodes RME and the via insulating layer VIA, so that they can emit light in certain wavelength bands by receiving an electrical signal.

The first connection electrode CNE1 of the connection electrodes CNE may be disposed on the second passivation layer PAS2. The first connection electrode CNE1 may partially overlap the first alignment electrode RME1 in the emission area EMA and may be electrically connected with the first ends 91 of the light-emitting elements ED.

The first connection electrode CNE1 may be disposed to extend from the emission area EMA and beyond the outer bank BNL as shown in FIG. 7. The first connection electrode CNE1 may be electrically connected with the first alignment electrode RME1 through the first contact location CT1 that penetrates through the first passivation layer PAS1 and the second passivation layer PAS2. Accordingly, the first connection electrode CNE1 may be electrically connected to the first transistor T1 so that the first supply voltage may be applied thereto.

The third passivation layer PAS3 may be disposed on the second passivation layer PAS2, the first connection electrode CNE1, and the outer bank layer BNL. The third passivation layer PAS3 may not cover the ends of the light-emitting elements ED. In other words, the third passivation layer PAS3 may not cover the second ends 92 of the light-emitting elements ED that may not be in contact with the first connection electrode CNE1 in the emission area EMA.

The third passivation layer PAS3 may include the second contact location CT2 overlapping the second alignment electrode RME2. The second contact location CT2 may penetrate the third passivation layer PAS3 to expose a part of the upper surface of the second alignment electrode RME2 thereunder.

The second alignment electrode RME2 exposed by the second contact location CT2 may be electrically connected with the second connection electrode CNE2. Accordingly, the light-emitting elements ED may be electrically connected with the connection electrodes CNE and may be electrically connected to the circuit element layer CCL under the alignment electrodes RME and under the via insulating layer VIA, and may emit light in certain wavelength bands by receiving an electrical signal.

The second connection electrode CNE2 of the connection electrodes CNE may be disposed on the third passivation layer PAS3. The second connection electrode CNE2 may partially overlap the second alignment electrode RME2 in the emission area EMA and may be electrically connected with the second ends 92 of the light-emitting elements ED.

The second connection electrode CNE2 may be disposed to extend from the emission area EMA beyond the outer bank BNL as shown in FIG. 7. The second connection electrode CNE2 may be electrically connected with the second alignment electrode RME2 through the second contact location CT2 that penetrates the first passivation layer PAS1, the second passivation layer PAS2 and the third passivation layer PAS3. Accordingly, the second connection electrode CNE2 may be electrically connected to the second voltage line VL2 so that the second supply voltage may be applied thereto.

The connection electrodes CNE may include a conductive material. For example, the connection electrodes CNE may include ITO, IZO, ITZO, aluminum (Al), or a combination thereof, etc. For example, the connection electrodes CNE may include a transparent conductive material, and light emitted from the light-emitting elements ED may transmit through the connection electrodes CNE to exit the display device 1.

Each of the above-described first passivation layer PAS1, second passivation layer PAS2 and third passivation layer PAS3 may include an inorganic insulating material or an organic insulating material. According to an embodiment of the disclosure, the first passivation layer PAS1, the second passivation layer PAS2, and the third passivation layer PAS3 may include at least one of silicon oxide (SiOx), silicon nitride (SiNx), and silicon oxynitride (SiOxNy). The first passivation layer PAS1, the second passivation layer PAS2, and the third passivation layer PAS3 may include a same material. Alternatively, some of them may include a same material while the other(s) may include different material(s), or they may all include different materials.

Hereinafter, structures of the grounding part and alignment signal lines disposed in the non-display area of the display device according to an embodiment will be described.

Figure 8:
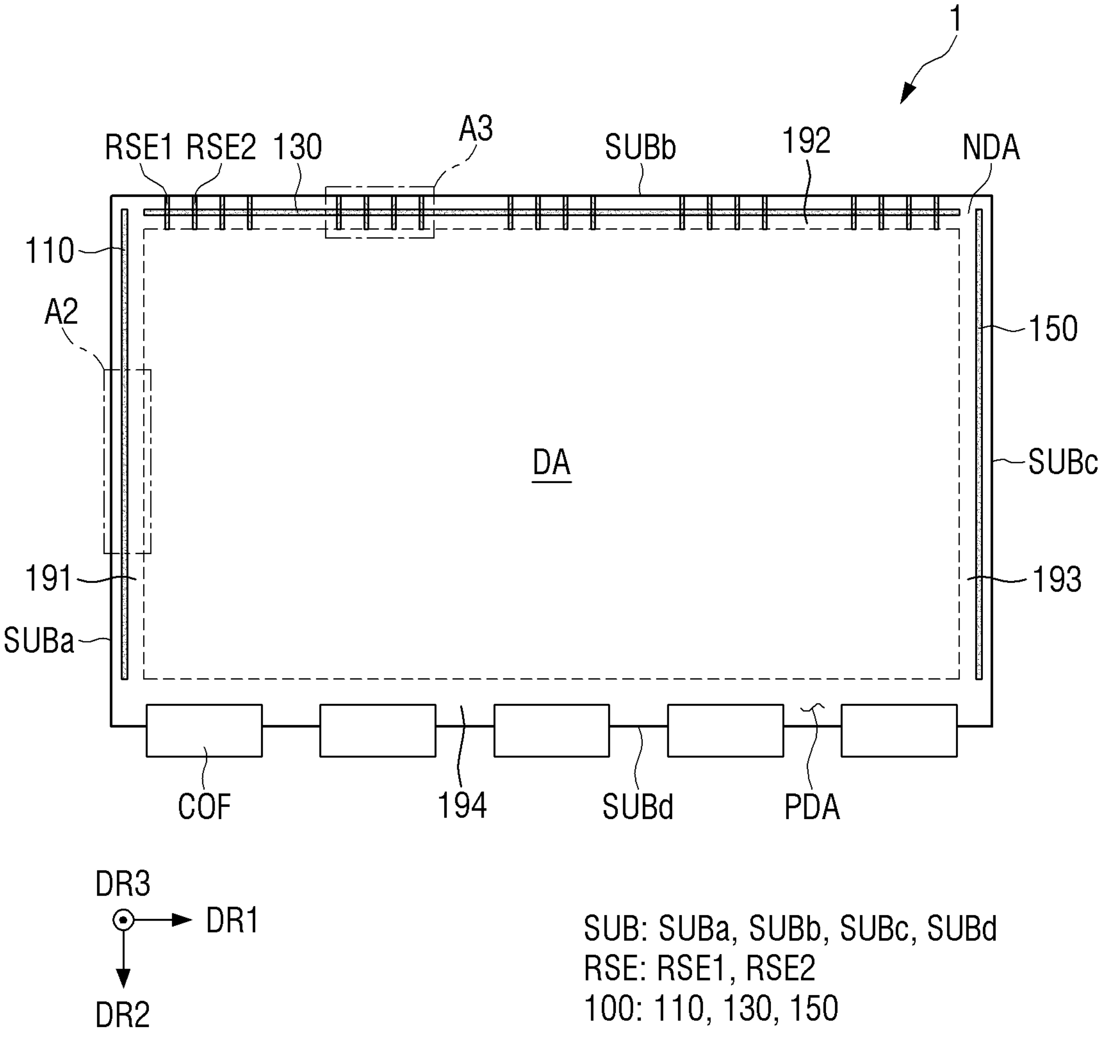
FIG. 8 is a plan view showing a grounding part and alignment signal lines disposed in a non-display area of a display device according to an embodiment.
Figure 9:
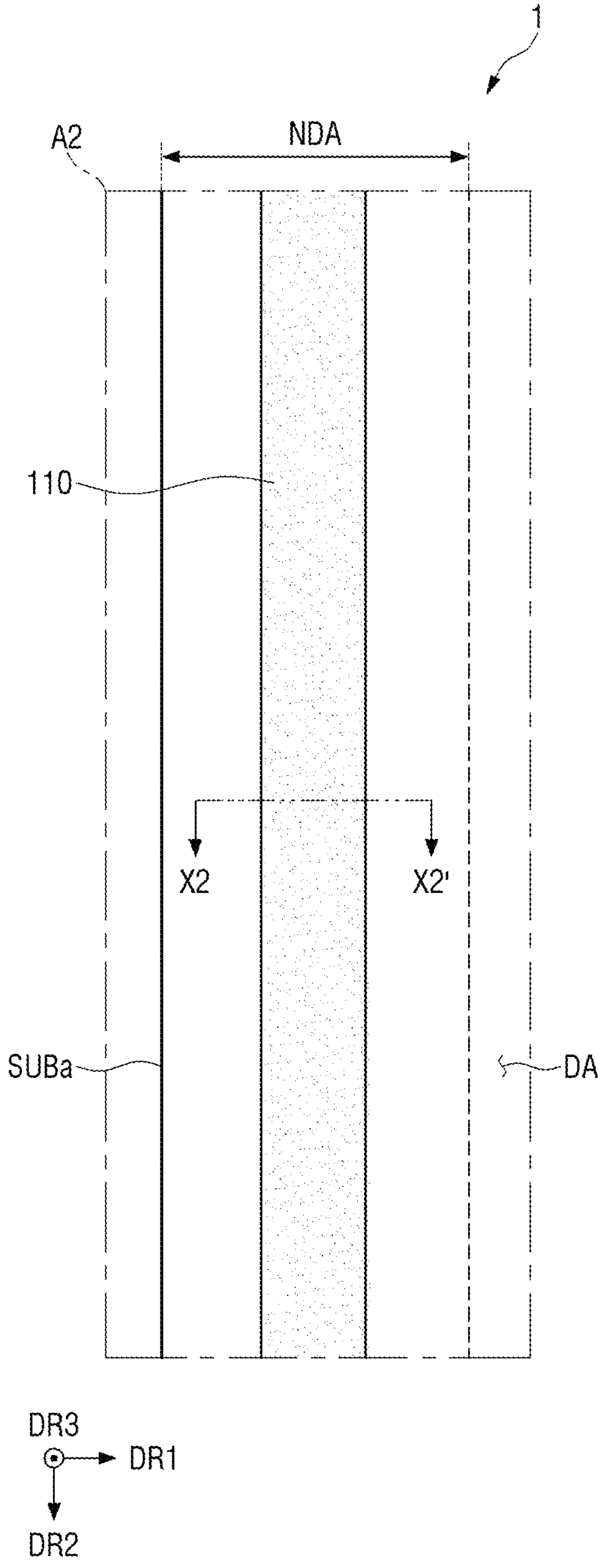
FIG. 9 is an enlarged view of area A2 of FIG. 8.
Figure 11:
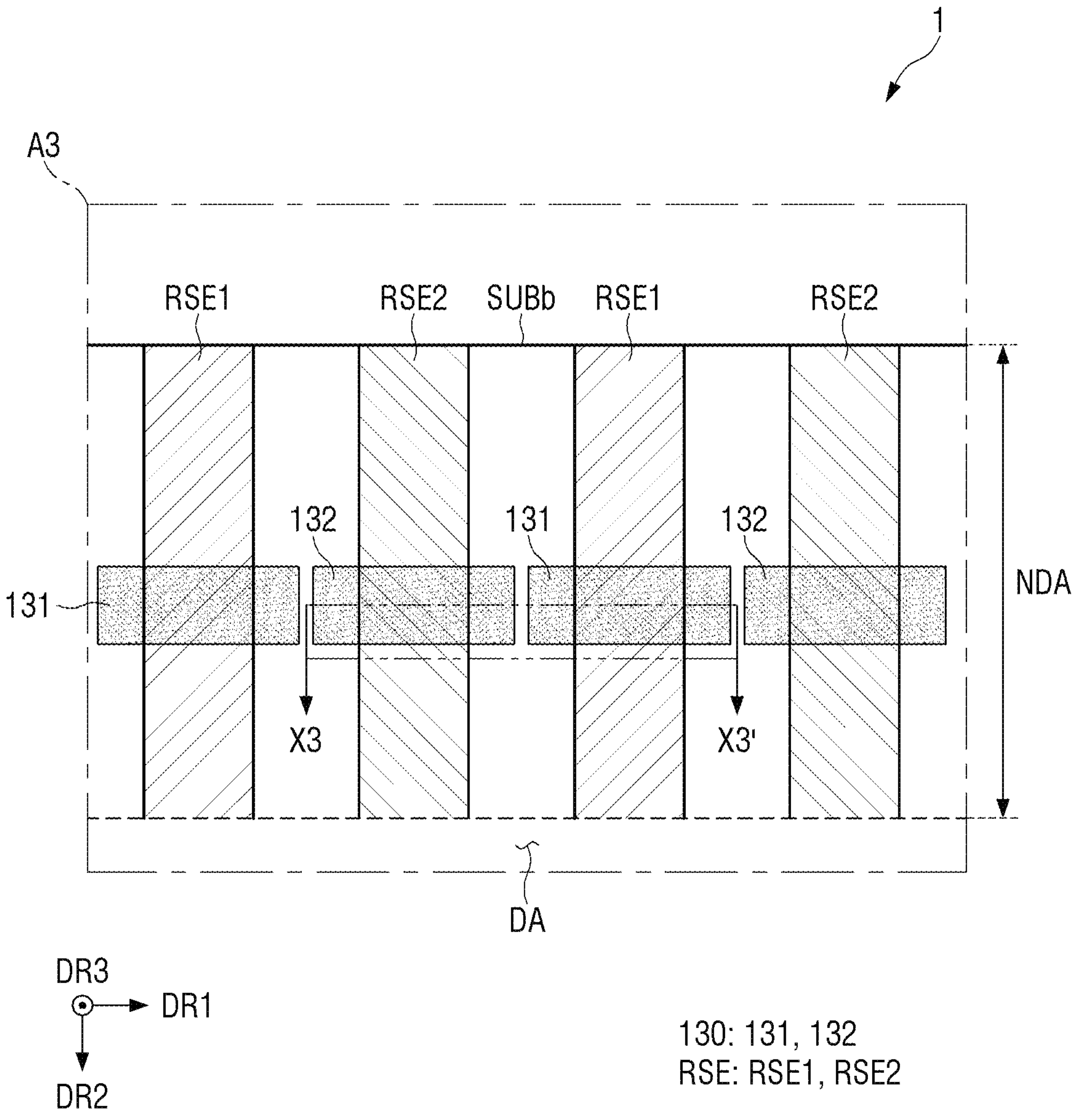
FIG. 11 is an enlarged view of area A3 of FIG. 8.

FIG. 8 is a plan view showing a grounding part and alignment signal lines disposed in a non-display area of a display device according to an embodiment. FIG. 9 is an enlarged view of area A2 of FIG. 8. FIG. 10 is a schematic cross-sectional view taken along line X2-X2' of FIG. 9. FIG. 11 is an enlarged schematic view of area A3 of FIG. 8. FIG. 12 is a schematic cross-sectional view taken along line X3-X3' of FIG. 11.

Referring to FIGS. 8 to 12, a display device 1 according to an embodiment may include flexible printed circuit boards COF, a grounding part 100, and alignment signal lines RSE disposed in the non-display area NDA of the substrate SUB.

According to the embodiment of the disclosure, the substrate SUB of the display device 1 may have a rectangular shape having longer peripheral edges extending in the first direction DR1 and shorter peripheral edges extending in the second direction DR2 when viewed from the top. For example, the substrate SUB may include a first peripheral edge SUBa disposed at a side in the first direction DR1 and extending in the second direction DR2; a second peripheral edge SUBb disposed at a side in the second direction DR2 and extending in the first direction DR1; a third peripheral edge SUBc disposed on another side in the first direction DR1 and extending in the second direction DR2; and a fourth peripheral edge SUBd disposed on another side in the second direction DR2 and extending in the first direction DR1, as the peripheral edges of the substrate SUB.

The first peripheral edge SUBa and the third peripheral edge SUBc may face each other in the first direction DR1, and the second peripheral edge SUBb and the fourth peripheral edge SUBd may face each other in the second direction DR2. The fourth peripheral edge SUBd may extend in a first direction DR1 from an end of the first peripheral edge SUBa to an end of the third peripheral edge SUBc. The second peripheral edge SUBb may also extend in the first direction DR1 from another end of the first peripheral edge SUBa to another end of the third peripheral edge SUBc.

The display area DA of the substrate SUB may generally occupy the center of the substrate SUB. Pixels PX may be disposed in the display area DA of the substrate SUB. The non-display area NDA may be disposed around the display area DA. The non-display area NDA may surround the display area DA entirely or partially. In some embodiments, the display area DA may have a rectangular shape, and the non-display areas NDA may be disposed to be adjacent to four sides or borders of the display area DA. It should be understood, however, that the disclosure is not limited thereto. In the example shown in FIG. 8, the display area DA has a rectangular shape, and the non-display area NDA may be disposed adjacent to the four sides or border of the display area DA.

The non-display area NDA may include a first area 191 disposed between the first peripheral edge SUBa of the substrate SUB and the display area DA; a second area 192 disposed between the second peripheral edge SUBb of the substrate SUB and the display area DA; a third area 193 disposed between the third peripheral edge SUBc of the substrate SUB and the display area DA; and a fourth area 194 disposed between the fourth peripheral edge SUBd of the substrate SUB and the display area DA.

The grounding part 100 may be disposed in the first area 191, the second area 192 and the third area 193 of the non-display area NDA of the substrate SUB. The grounding part 100 may be disposed near the peripheral edges of the substrate SUB and serve to prevent damage to the device due to static electricity generated from the outside, or due to static electricity possibly generated during the process of forming the circuit element layer CCL of the method of fabricating the display device 1. The grounding part 100 may include a first ground line 110 disposed in the first area 191 of the non-display area NDA, a ground pattern part 130 disposed in the second area 192 of the non-display area NDA, and a second ground line 150 disposed in the third area 193 of the non-display area NDA.

As shown in FIG. 9, the first ground line 110 of the grounding part 100 may be disposed in the first area 191 of the non-display area NDA, i.e., between the first peripheral edge SUBa of the substrate SUB and the display area DA, and may extend in the second direction DR2. The first ground line 110 may be spaced apart from the first peripheral edge SUBa of the substrate SUB in the first direction DR1, and may be spaced apart from the display area DA in the first direction DR1.

As shown in FIG. 10, the first ground line 110 may include a first layer 110*a* in direct contact with the upper surface of the substrate SUB, and a second layer 110*b* disposed on the first layer 110*a*. The first layer 110*a* may include a material substantially a same as that of the first conductive layer of the circuit element layer CCL, and the second layer 110*b* may include a material substantially a same as that of the second conductive layer of the circuit element layer CCL. In other words, the first conductive layer of the circuit element layer CCL may further include the first layer 110*a* of the first ground line 110 disposed in the first area 191 of the non-display area NDA, and the second conductive layer may further include the second layer 110*b* of the first ground line 110 disposed in the first area 191 of the non-display area NDA.

Accordingly, as shown in FIG. 10, in the first area 191 of the non-display area NDA, the substrate SUB, the first layer 110*a* of the first ground line 110, the buffer layer BL, the first gate insulator GI, the second layer 110*b* of the first ground line 110, the first interlayer dielectric layer IL1, the first protective layer PV1, the via insulating layer VIA, the first passivation layer PAS1, the second passivation layer PAS2, and the third passivation layer PAS3 may be sequentially stacked on each other in the third direction DR3.

The ground pattern part 130 of the grounding part 100 may be disposed in the second area 192 of the non-display area NDA, i.e., between the second peripheral edge SUBb of the substrate SUB and the display area DA, as shown in FIG. 8. The ground pattern part 130 may be spaced apart from the second peripheral edge SUBb of the substrate SUB in the second direction DR2, and may also be spaced apart from the display area DA in the second direction DR2.

The ground pattern part 130 may include first ground patterns 131 and second ground patterns 132 that may be spaced apart from each other in the first direction DR1 and arranged alternately in the first direction DR1, as shown in FIG. 11. The first ground patterns 131 and the second ground patterns 132 may extend in the first direction DR1.

Since the first ground patterns 131 and the second ground patterns 132 may be spaced apart from each other and insulated from each other, voltages having different levels may be applied thereto. For example, a first voltage may be applied to the first ground patterns 131 through a separate voltage source (not shown), and a second voltage having a level different from that of the first voltage, which has a level lower than that of the first voltage, may be applied to the second ground patterns 132 through a separate voltage source (not shown). In some embodiments, the first voltage may have substantially a same level as the above-described first supply voltage, and the second voltage may have substantially a same level as the above-described second supply voltage. It should be understood, however, that the disclosure is not limited thereto.

In case different voltages may be applied to the first ground patterns 131 and the second ground patterns 132, respectively, the first ground patterns 131 and the second ground patterns 132 can stably prevent damage to the device by static electricity which may be generated external to the display device 1.

By applying the first voltage and the second voltage to the first ground patterns 131 and the second ground patterns 132, respectively, the first ground patterns 131 and the second ground patterns 132 can prevent damage by a voltage difference with the alignment signal lines RSE to be described later. This will be described in more detail later.

As shown in FIG. 12, the first ground pattern 131 may include a first layer 131*a* in direct contact with the upper surface of the substrate SUB, and a second layer 131*b* disposed on the first layer 131*a*. The first layer 131*a* may include a material substantially a same as that of the first conductive layer of the circuit element layer CCL, and the second layer 131*b* may include a material substantially a same as that of the second conductive layer of the circuit element layer CCL. In other words, the first conductive layer of the circuit element layer CCL may further include the first layer 131*a* of the first ground line 131 disposed in the second area 192 of the non-display area NDA, and the second conductive layer may further include the second layer 131*b* of the first ground pattern 131 disposed in the second area 192 of the non-display area NDA.

As shown in FIG. 12, the second ground pattern 132 may include a first layer 132*a* in direct contact with the upper surface of the substrate SUB, and a second layer 132*b* disposed on the first layer 132*a*. The first layer 132*a* may include a material substantially a same as that of the first conductive layer of the circuit element layer CCL, and the second layer 132*b* may include a material substantially a same as that of the second conductive layer of the circuit element layer CCL. In other words, the first conductive layer of the circuit element layer CCL may further include the first layer 132*a* of the second ground pattern 132 disposed in the second area 192 of the non-display area NDA, and the second conductive layer may further include the second layer 132*b* of the second ground pattern 132 disposed in the second area 192 of the non-display area NDA.

Accordingly, as shown in FIG. 12, in the second area 192 of the non-display area NDA, the substrate SUB, the first layer 131*a* of the first ground pattern 131, the first layer 132*a* of the second ground pattern 132, the buffer layer BL, the first gate insulator GI, the second layer 131*b* of the first ground pattern 131, the second layer 132*b* of the second ground pattern 132, the first interlayer dielectric layer IL1, the first protective layer PV1, the via insulating layer VIA, the first passivation layer PAS1, the second passivation layer PAS2, and the third passivation layer PAS3 may be sequentially stacked on each other in the third direction DR3.

The first ground patterns 131 and the second ground patterns 132 may overlap at least partially with the first alignment signal lines RSE1 and the second alignment signal lines RSE2 of the alignment signal lines RSE in the third direction DR3, respectively.

The alignment signal lines RSE may be disposed in the second area 192 of the non-display area NDA of the substrate SUB, as shown in FIG. 8. The alignment signal lines RSE may apply an alignment signal in a process of aligning the light-emitting elements ED in the fabrication process of the display device 1, which will be described later.

As shown in FIGS. 8 and 11, the alignment signal lines RSE may include first alignment signal lines RSE1 and second alignment signal lines RSE2 that may be spaced apart from one another in the first direction DR1 and may be arranged alternately in the first direction DR1. The first alignment signal lines RSE1 and the second alignment signal lines RSE2 may extend in the second direction DR2. For example, the first alignment signal lines RSE1 and the second alignment signal lines RSE2 may extend from the second peripheral edge SUBb of the substrate SUB to the display area DA in the second direction DR2.

Voltages having different levels may be applied to the first alignment signal lines RSE1 and the second alignment signal lines RSE2. For example, the first voltage may be applied to the first alignment signal lines RSE1, and the second voltage having a lower level than that of the first voltage may be applied to the second alignment signal lines RSE2.

Accordingly, even though the first alignment signal line RSE1 and the first ground pattern 131 overlap each other in the third direction DR3, since the first voltage is applied to both the first alignment signal line RSE1 and the first ground pattern 131, no voltage difference is generated between the first alignment signal line RSE1 and the first ground pattern 131. As a result, it is possible to prevent or reduce damage due to a voltage difference. Even though the second alignment signal line RSE2 and the second ground pattern 132 overlap each other in the third direction DR3, since the second voltage is applied to both the second alignment signal line RSE2 and the second ground pattern 132, no voltage difference is generated between the second alignment signal line RSE2 and the second ground pattern 132. As a result, it is possible to prevent or reduce damage due to a voltage difference.

As shown in FIG. 8, the second ground line 150 of the grounding part 100 may be disposed in the third area 193 of the non-display area NDA, i.e., between the third peripheral edge SUBc of the substrate SUB and the display area DA, and may extend in the second direction DR2. The second ground line 150 may be spaced apart from the third peripheral edge SUBc of the substrate SUB in the first direction DR1, and may also be spaced apart from the display area DA in the first direction DR1.

The second ground line 150 has substantially a same structure as the first ground line 110, and thus the structure of the second ground line 150 will not be described.

The pad area PDA may be located in the fourth area 194 of the non-display area NDA, and flexible printed circuit boards COF may be mounted in the pad area PDA. A driving chip that generates a driving signal for driving the pixels PX may be mounted on each of the flexible printed circuit boards COF.

In the fourth area 194 of the non-display area DA, it is possible to prevent damage to the device due to static electricity which may be generated external to the display device 1 by the flexible printed circuit boards COF. Therefore, the grounding part 100 may not be disposed in the fourth area 194 of the non-display area DA.

Hereinafter, processes of fabricating a display device according to an embodiment of the disclosure will be described.

FIGS. 13 to 22 are schematic cross-sectional views for illustrating a method of fabricating a display device according to an embodiment of the disclosure.

Figure 13:
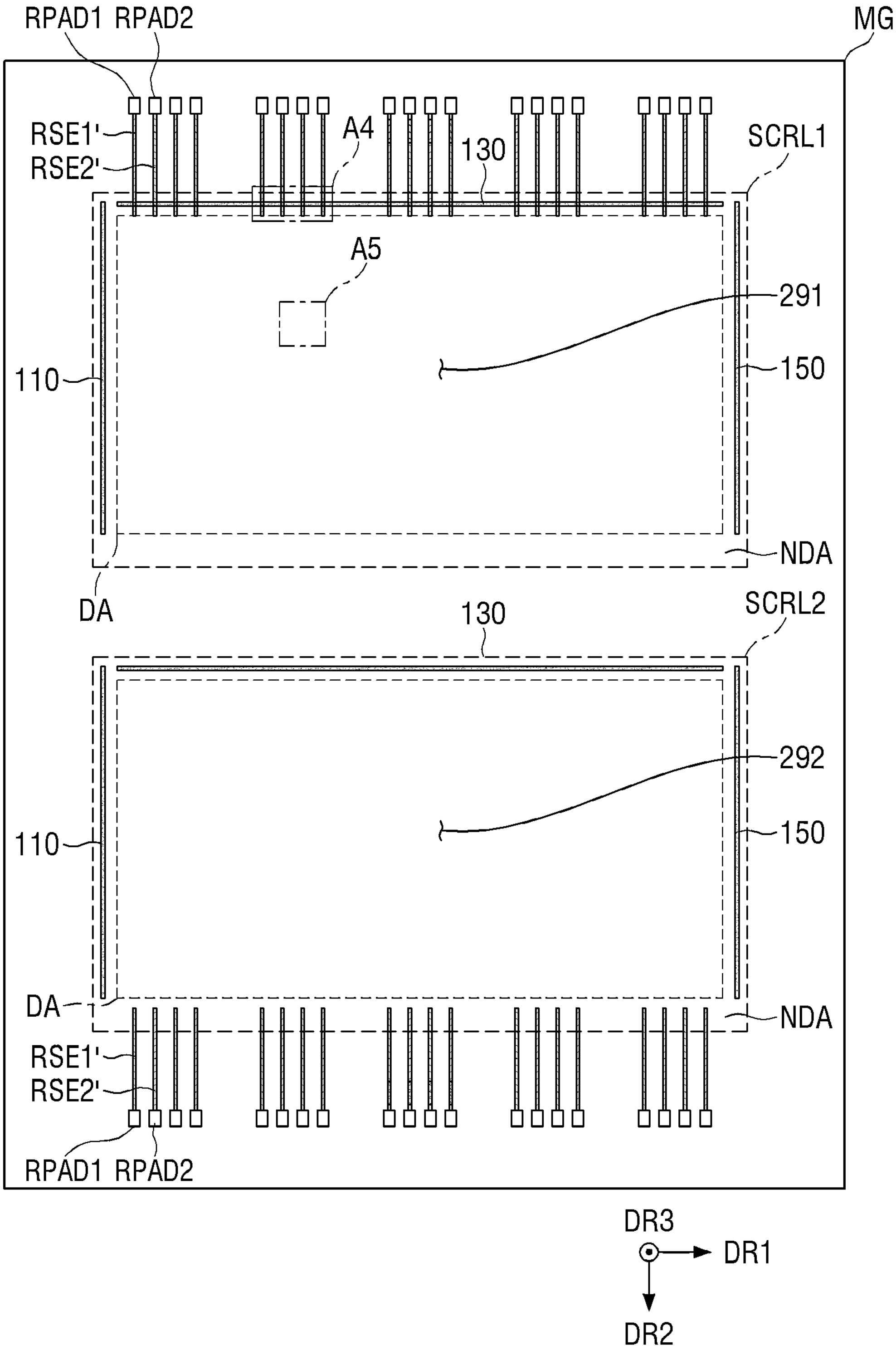
FIGS. 13 to 22 are schematic cross-sectional views for illustrating a method of fabricating a display device according to an embodiment of the disclosure.
Figure 14:
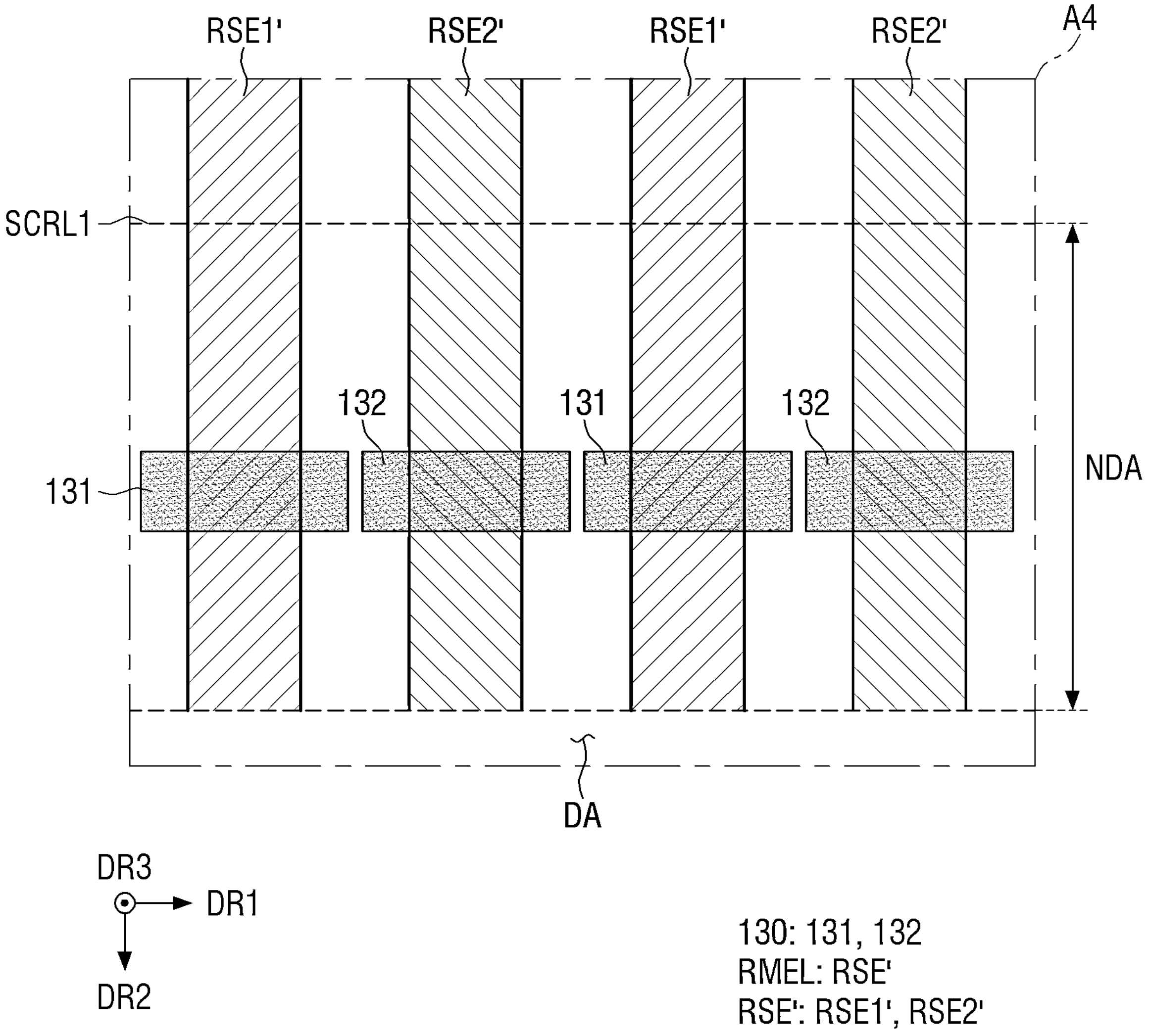
Figure 15:
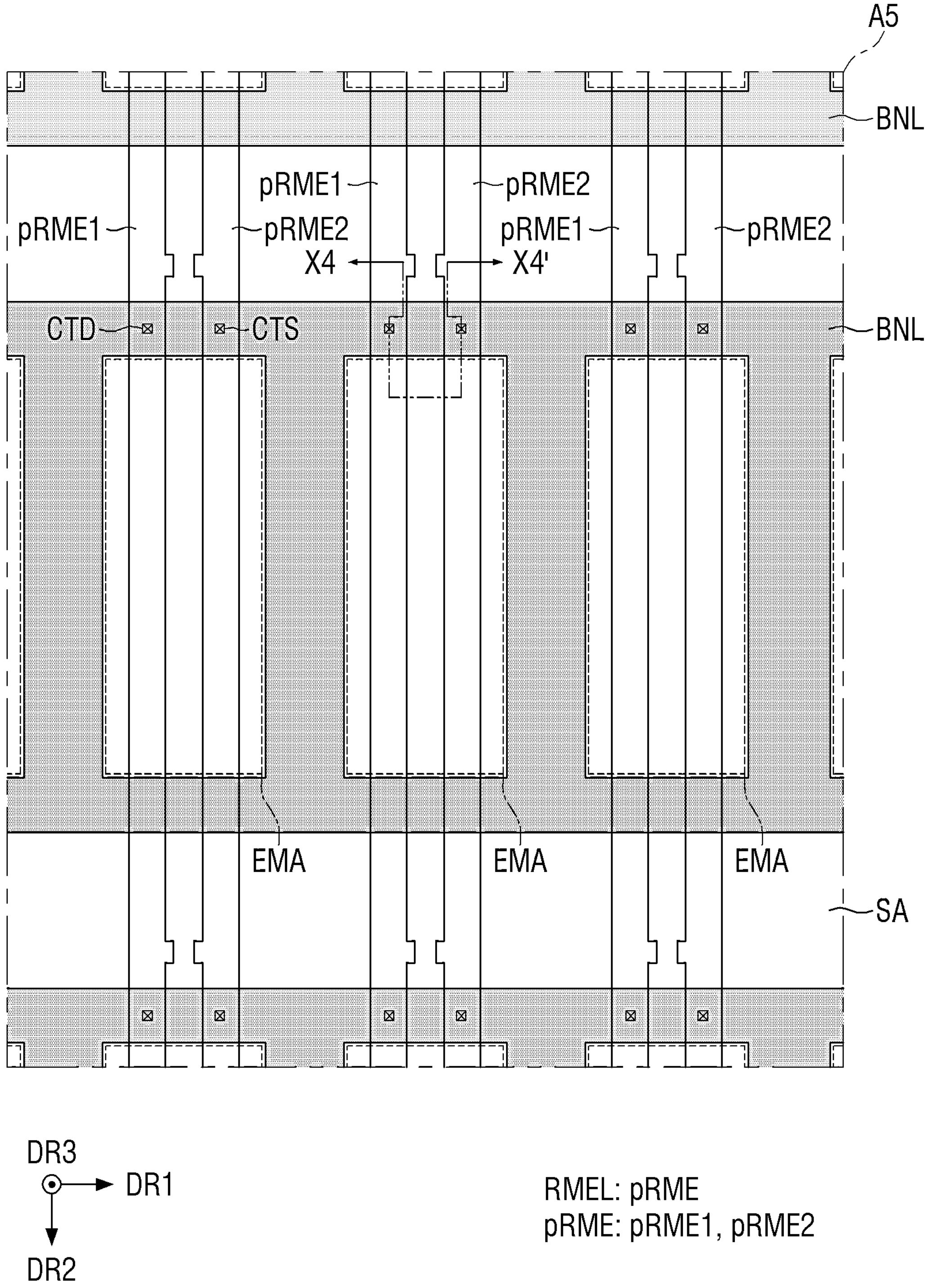
Figure 16:
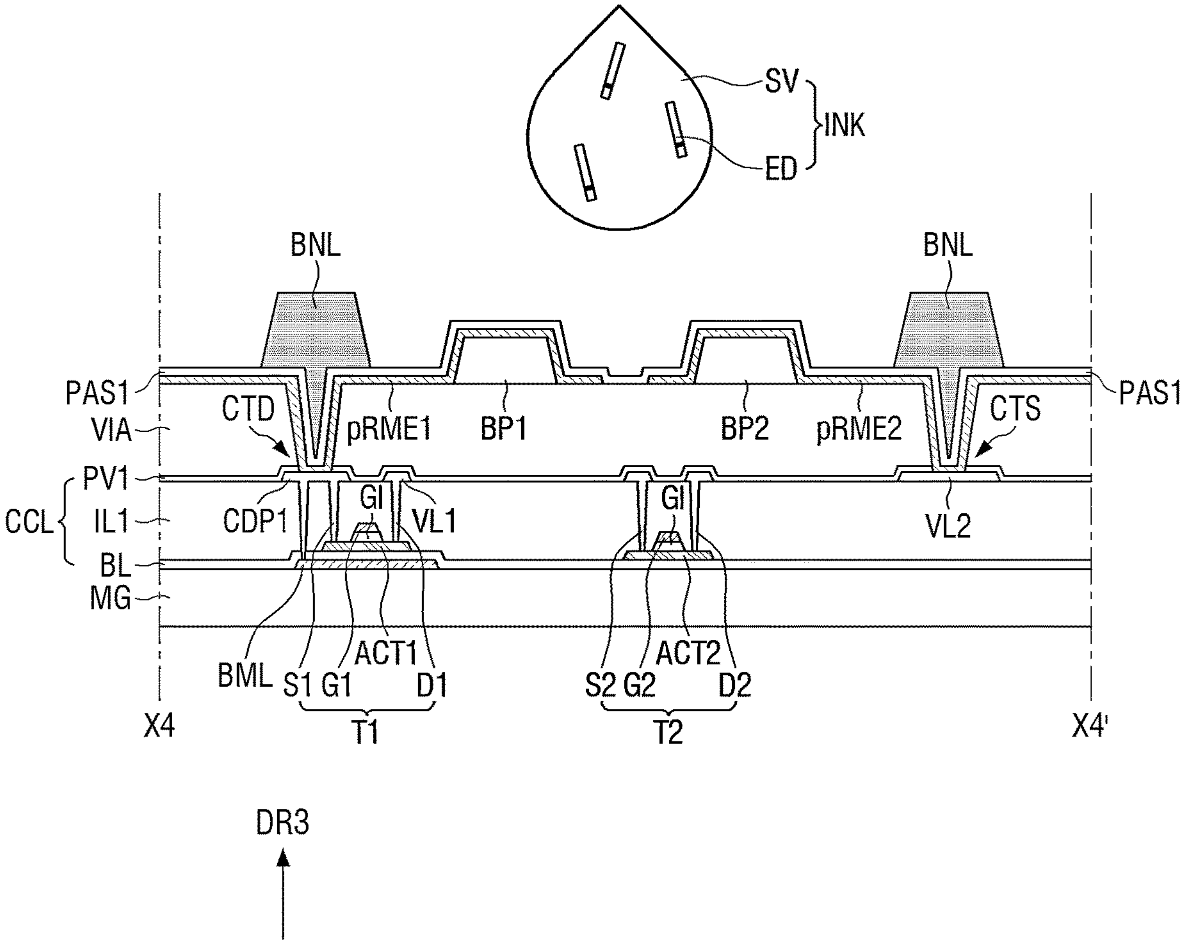
Figure 17:
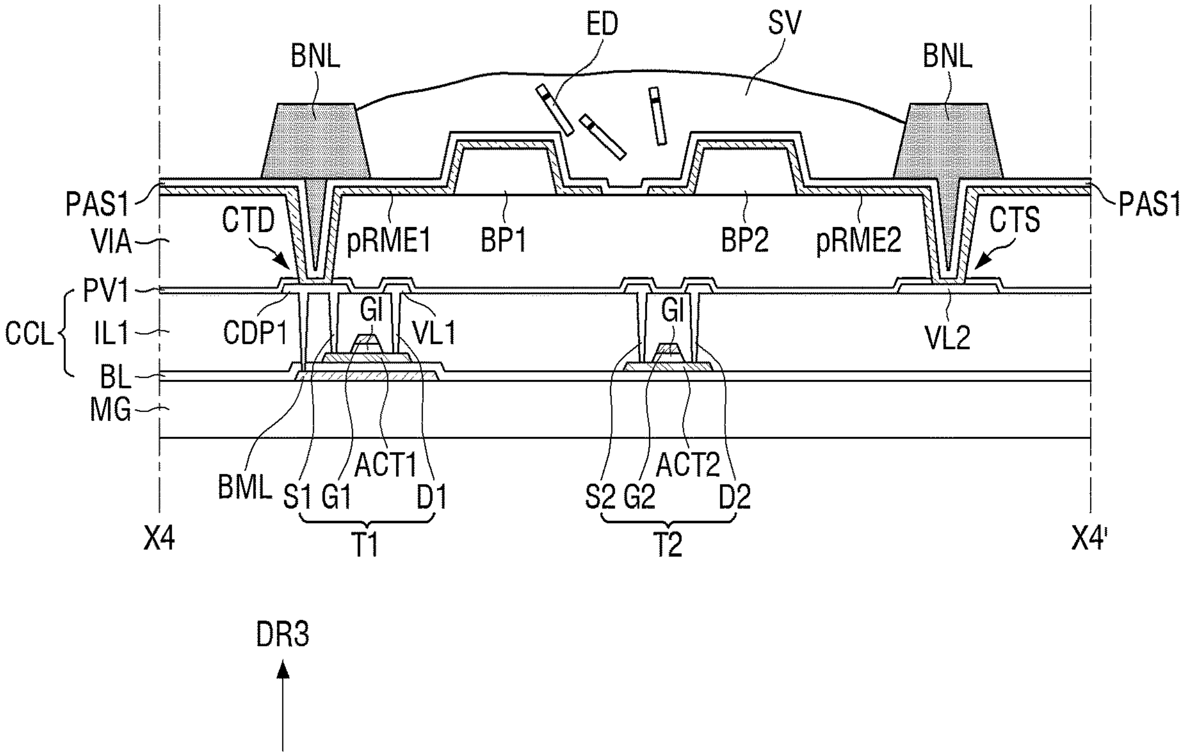
Figure 18:
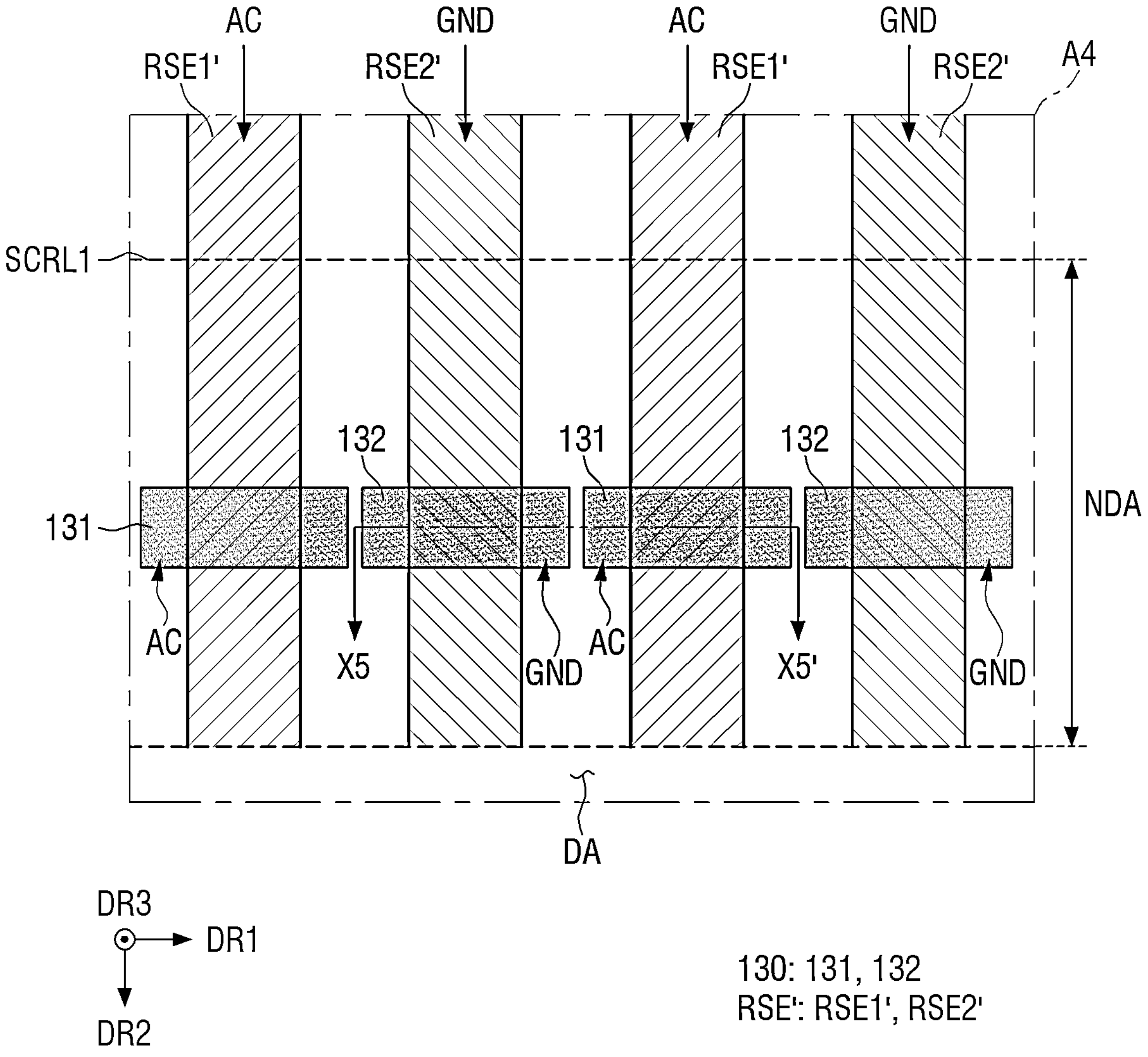
Figure 21:
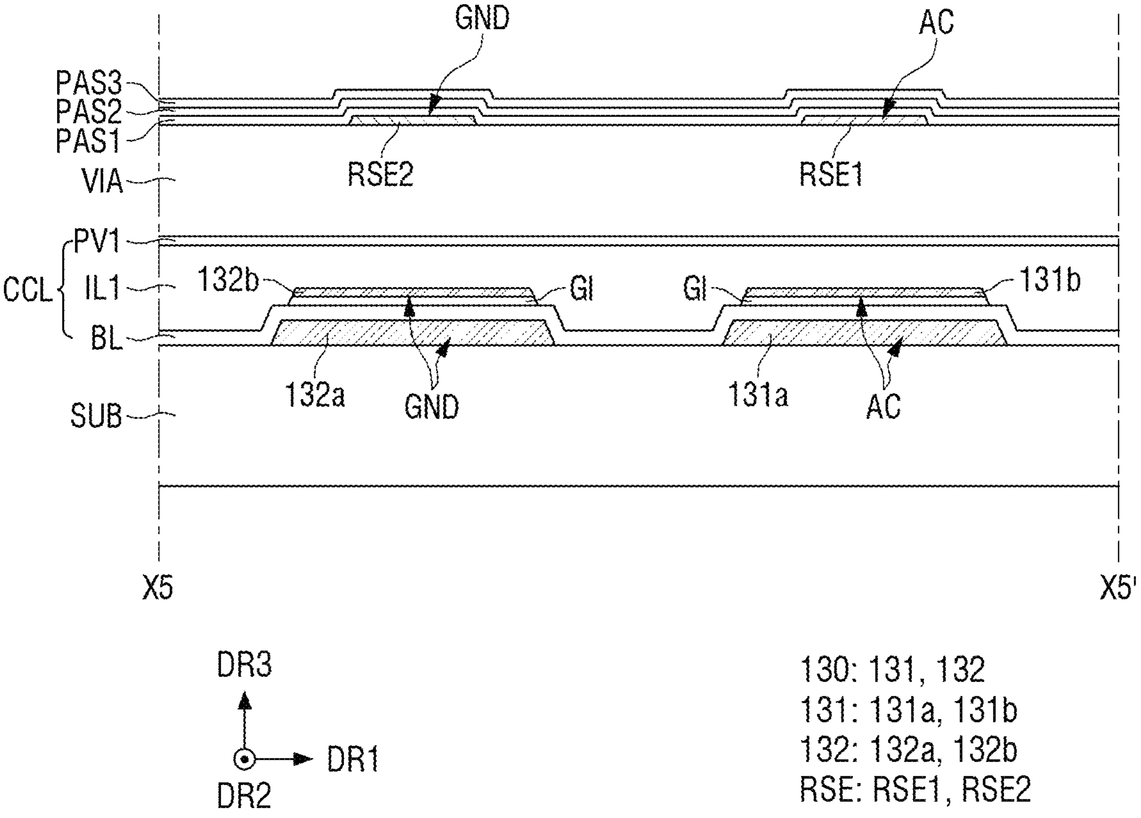
Figure 22:
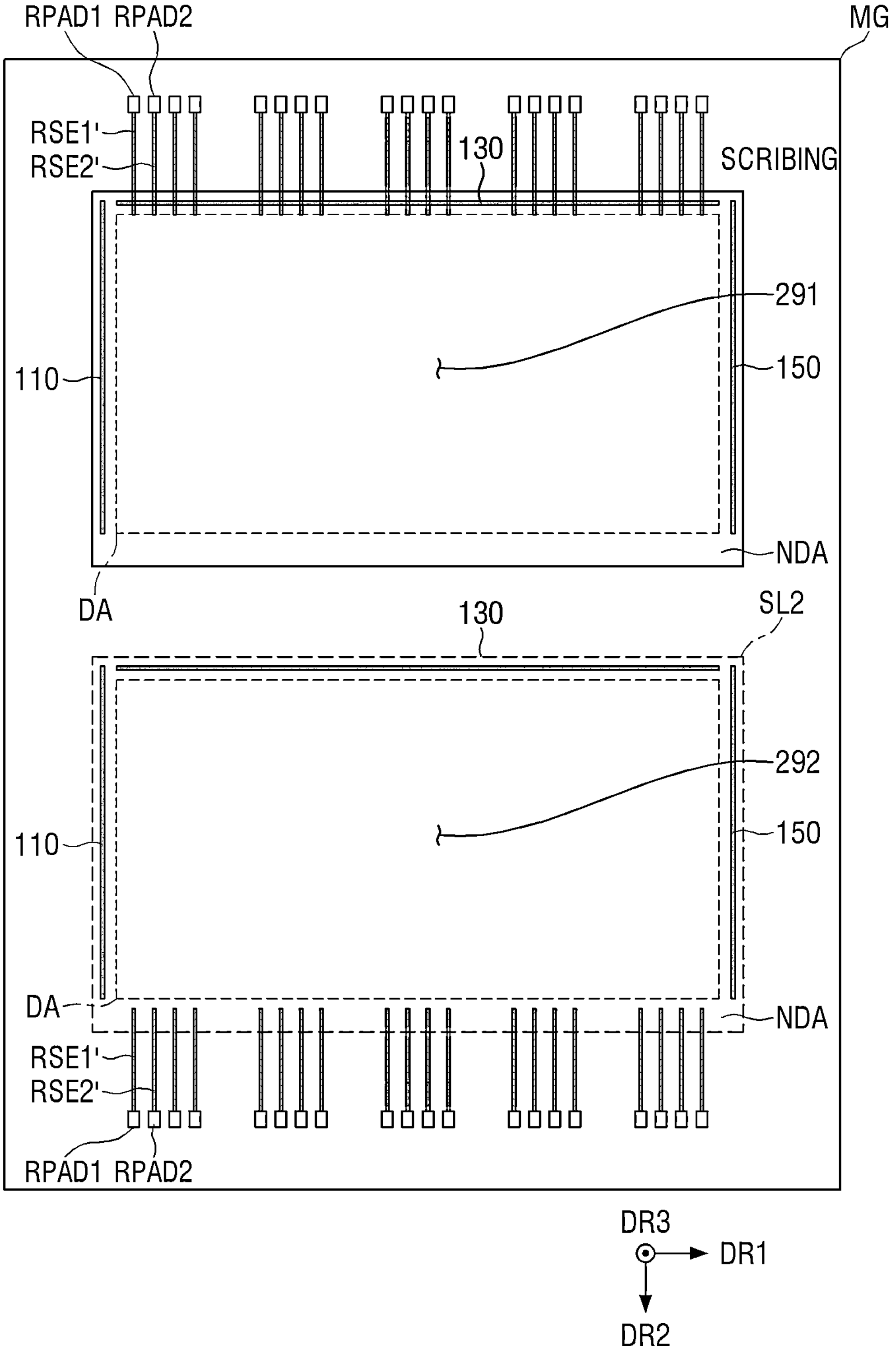

FIG. 13 shows a first scribing line SCRL1 and a second scribing line SCRL2 defined on a mother glass MG. FIG. 14 is an enlarged view showing area A4 of FIG. 13. FIG. 15 is an enlarged view showing area A5 of FIG. 13. FIGS. 16, 17, 19 and 20 are schematic cross-sectional views showing a process in which the light-emitting elements ED may be aligned, taken along line X4-X4' of FIG. 15. FIG. 18 is an enlarged view showing area A4 of FIG. 13 but also shows a first alignment signal AC being applied to the first alignment signal lines RSE1', and a second alignment signal GND being applied to the second alignment signal lines RSE2'. FIG. 21 is a schematic cross-sectional view taken along line X5-X5' of FIG. 18. FIG. 22 shows that the display device 1 according to the embodiment is obtained by breaking the mother glass MG along the first scribing line SCRL1 defined thereon.

Initially, referring to FIGS. 13 to 17, a circuit element layer CCL, a via insulating layer VIA, inner banks BP, an alignment electrode layer RMEL, a first passivation layer PAS1 and an outer bank BNL may be sequentially formed on the mother glass MG. An ink INK in which the light-emitting elements ED may be dispersed in a solvent SV is discharged into the space between the first alignment electrode pattern pRME1 and the second alignment electrode pattern pRME2 of the alignment electrode layer RMEL.

The first scribing line SCRL1 and the second scribing line SCRL2 may be defined on the mother substrate MG. Each of the first scribe line SCRL1 and the second scribe line SCRL2 may define a rectangular cell area 290. For convenience of illustration, the area of the mother substrate MG surrounded by the first scribing line SCRL1 is referred to as a first cell area, and the area of the mother substrate MG surrounded by the second scribing line SCRL2 is referred to as a second cell area 292.

A display area DA may be defined in each of the first cell area 291 and the second cell area 292. As described above, the light-emitting elements ED may be disposed in the display area DA so that images may be displayed thereon. The display area DA may be disposed at the center of each of the first cell area 291 and the second cell area 292.

The area between the first scribing line SCRL1 and the display area DA of the first cell area 291 and the area between the second scribing line SCRL2 and the display area DA of the second cell area 292 may correspond to the non-display area NDA where no image is displayed. The non-display area NDA may surround the display area DA for each of the first cell area 291 and the second cell area 292. The non-display area NDA is identical to the non-display area NDA described above with reference to FIG. 8 and therefore a redundant description will be omitted.

The grounding part 100 as shown in FIG. 8 is formed in the non-display area NDA surrounding each of the first cell area 291 and the second cell area 292. The grounding part 100 can prevent damage to the device due to static electricity generated in the process of forming the circuit element layer CCL.

Alignment signal pads RPAD and alignment signal lines RSE' of the alignment electrode layer RMEL may be disposed at the outer periphery of each of the first cell area 291 and the second cell area 292. The alignment signal pads RPAD may include first alignment signal pads RPAD1 that apply a first alignment signal AC, and second alignment signal pads RPAD2 that apply a second alignment signal GND, which will be described later. The alignment signal lines RSE' may include first alignment signal lines RSE1' electrically connected to the first alignment signal pads RPAD1 and second alignment signal lines RSE2' electrically connected to the second alignment signal pads RPAD2.

For example, on a top side of the first cell area 291 and on a bottom and opposite side of the second cell area 292 in the second direction DR2, the first alignment signal pads RPAD1 and the second alignment signal pads RPAD2 may be arranged in an alternate manner in the first direction DR1, and the first alignment signal lines RSE1' and the second alignment signal lines RSE2' may also be arranged in an alternate manner in the first direction DR1.

For the first cell area 291, the first alignment signal lines RSE1' and the second alignment signal lines RSE2' may extend from the first alignment signal pads RPAD1 and the second alignment signal pads RPAD2 respectively, where alignment signal pads RPAD1 and RPAD2 may be disposed external to the first cell area 291 in the second direction DR2 from beyond a peripheral edge of the display area DA in the second direction beyond the second area 192 of the non-display area NDA of the first cell area 291. In other words, in the first cell area 291, the first alignment signal lines RSE1' and the second alignment signal lines RSE2' may extend to the display area DA of the first cell area 291 from beyond the first scribing line SCRL1 in the second direction DR2, as shown in FIGS. 13 and 15.

For the second cell area 292, the first alignment signal lines RSE1' and the second alignment signal lines RSE2' may extend from the first alignment signal pads RPAD1 and the second alignment signal pads RPAD2 respectively disposed at the outer periphery of the second cell area 292 on a side in the second direction DR2 corresponding to the fourth area 184 of the non-display area NDA of the second cell area 292 to be electrically connected to wire pads (not shown) disposed in the fourth area 184.

As the first alignment signal lines RSE1' and the second alignment signal lines RSE2' may be disposed in each of the first cell area 291 and the second cell area 292 as described above, the pixels disposed in the display area DA of each of the first cell area 291 and the second cell area 292 have substantially a same relative position. Therefore, after a process of aligning the light-emitting elements ED, which will be described later, it may be readily checked whether the light-emitting elements ED may be properly aligned.

Since the first alignment signal line RSE1' and the second alignment signal line RSE2' may be disposed in each of the first cell area 291 and the second cell area 292 in the above-described manner, the first cell area 291 may become the display device 1 according to the embodiment by breaking it along the first scribing line SCRL1 via a subsequent process to be described later, and the second cell area 292 may be obtained as a display device different from the display device 1 according to the embodiment.

The first alignment signal lines RSE1' and the second alignment signal lines RSE2' may be electrically connected to the alignment electrode patterns pRME disposed in the display area DA of each of the first cell area 291 and the second cell area 292. Hereinafter, the first cell area 291 will be described for convenience of illustration.

For the first cell area 291, in the display area DA, the alignment electrode patterns pRME may be disposed as part of the alignment electrode layer RMEL as shown in FIG. 15. The alignment electrode patterns pRME may include first alignment electrode patterns pRME1 and second alignment electrode patterns pRME2 that may be arranged alternately in the first direction DR1.

The alignment electrode layer RMEL may include the alignment electrode patterns pRME disposed in the display area DA and the alignment signal lines RSE' disposed in the non-display area NDA. In other words, the alignment signal lines RSE' and the alignment electrode patterns pRME may be simultaneously formed via a same process.

Accordingly, the alignment signal lines RSE' and the alignment electrode patterns pRME may be integral with each other and electrically connected with each other. For example, the first alignment signal line RSE1' may be electrically connected to at least one first alignment electrode pattern pRME1, and the second alignment signal line RSE2' may be electrically connected to at least one second alignment electrode pattern pRME2.

The first alignment electrode patterns pRME1 and the second alignment electrode patterns pRME2 may extend in the second direction DR2 as a single piece and may traverse the display area DA. The first alignment electrode patterns pRME1 and the second alignment electrode patterns pRME2 may become the first alignment electrodes RME1 and the second alignment electrodes RME2, respectively, as shown in FIG. 4 via a subsequent etching process. For example, the first alignment electrode pattern pRME1 may become first alignment electrodes RME1 separated at a separation region ROP (see FIG. 4) via a subsequent etching process, and the second alignment electrode pattern pRME2 may become second alignment electrodes RME2 separated at the separation region ROP.

Subsequently, referring to FIGS. 18 to 21, after discharging the light-emitting elements ED, alignment signals may be applied to the first cell area 291 to align the light-emitting elements ED. The process of aligning the light-emitting elements ED may be performed using a dielectrophoresis (DEP) force caused by an electric field generated by the alignment signals having different voltage levels.

The alignment signals may include a first alignment signal AC and a second alignment signal GND having a lower level than that of the first alignment signal AC. The first ends 91 of the light-emitting elements ED may be aligned in the direction in which the first alignment signal AC is applied, and the second ends 92 of the light-emitting elements ED may be aligned in the direction in which the second alignment signal GND is applied.

Figure 19:
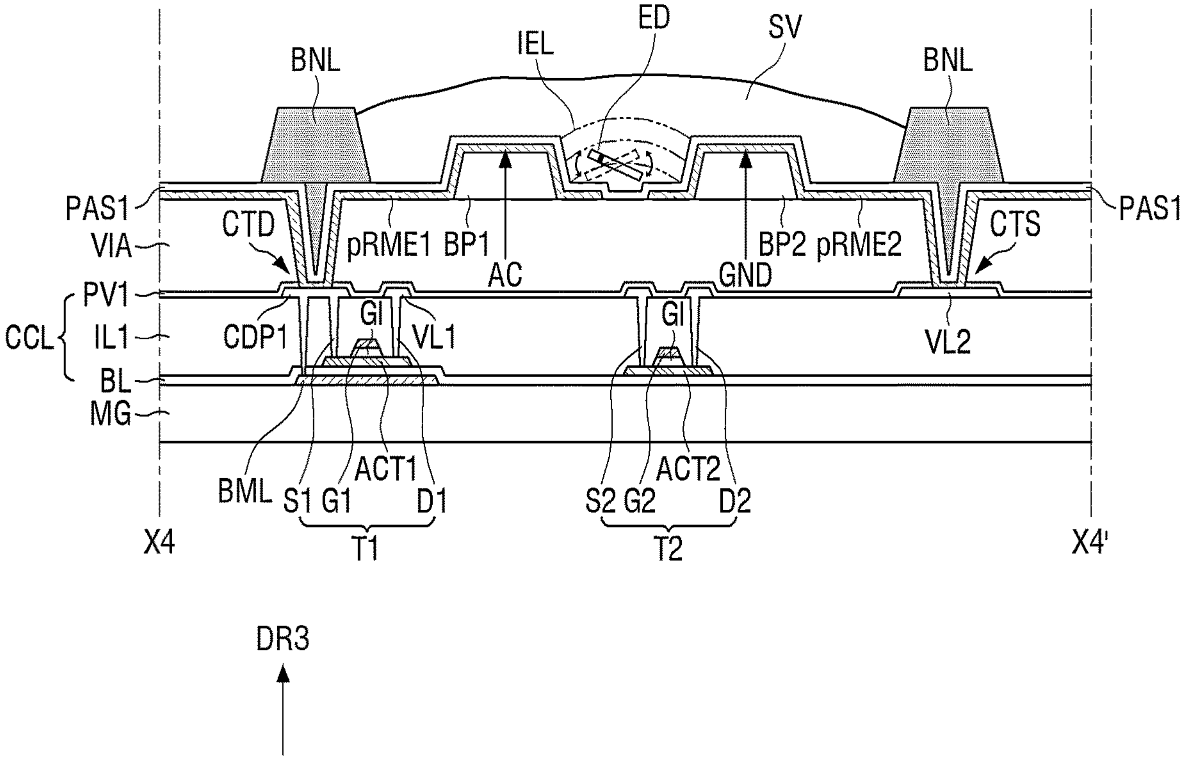
Figure 20:
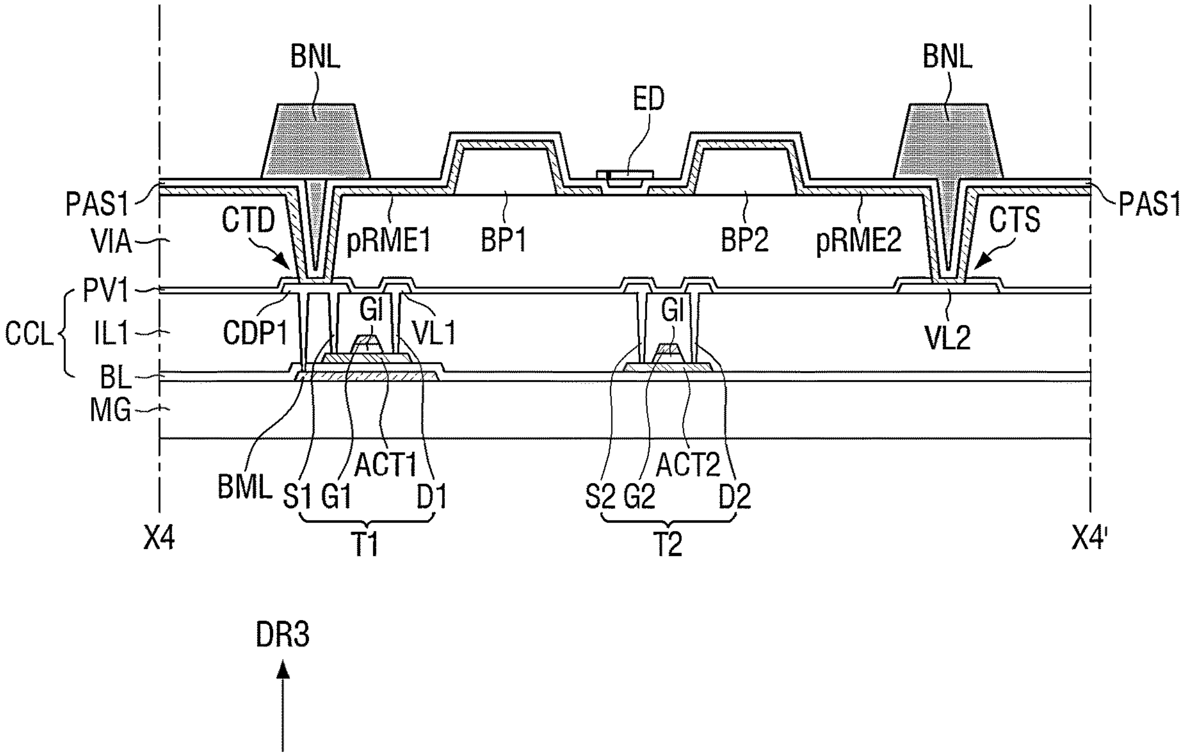

For example, as shown in FIGS. 18 to 20, the first alignment signal AC may be applied from the first alignment signal pad RPAD1 to the first alignment electrode pattern pRME1 through the first alignment signal line RSE1', and the second alignment signal GND may be applied from the second alignment signal pad RPAD2 to the second alignment electrode pattern pRME2 through the second alignment signal line RSE2' to form an electric field IEL. The light-emitting elements ED may be aligned by the electric field IEL so that the first ends 91 may be disposed on the first alignment electrode pattern pRME1 from which the first alignment signal AC is applied, and the second ends 92 may be disposed on the second alignment electrode pattern pRME2 from which the second alignment signal GND is applied.

In this instance, as shown in FIG. 21, the first alignment signal AC applied to the first alignment signal line RSE1' is also applied to the first ground pattern 131 overlapping the first alignment signal line RSE1' in the third direction DR3 so that there is no voltage difference between the first alignment signal line RSE1' and the first ground pattern 131, and the second alignment signal GND applied to the second alignment signal line RSE2' is also applied to the second ground pattern 132 overlapping the second alignment signal line RSE2' in the third direction DR3 so that there is no voltage difference between the second alignment signal line RSE2' and the second ground pattern 132. Accordingly, it is possible to prevent or reduce damage due to a voltage difference between the first alignment signal line RSE1' and the first ground pattern 131 or between the second alignment signal line RSE2' and the second ground pattern 132.

If the second alignment signal GND is applied to the first ground pattern 131, the second ground pattern 132 and the second alignment signal line RSE2' and the first alignment signal AC is applied to the first alignment signal line RSE1', there may be a voltage difference between the first ground pattern 131 and the first alignment signal line RSE1' and thus the first ground pattern 131 and the first alignment signal line RSE1' may be damaged. In view of the above, a same voltage as that of the first alignment signal line RSE1 is applied to the first ground pattern 131, and a same voltage as that of the second alignment signal line RSE2 is applied to the second ground pattern 132, so that it is possible to prevent or reduce damage caused by a voltage difference.

In some embodiments, the first alignment signal AC may be substantially identical to the first supply voltage, and the second alignment signal GND may be substantially identical to the second supply voltage. It should be understood, however, that the disclosure is not limited thereto.

Subsequently, referring to FIG. 22, the display device 1 according to the embodiment is obtained by breaking the mother glass MG along the first scribing line SCRL1. The first scribing line SCRL1 may be scribed by laser.

The first cell area 291 of the mother substrate MG may become the substrate SUB of the display device 1 according to the embodiment in case it is broken along the first scribing line SCRL1. Accordingly, the first alignment signal line RSE1' and the second alignment signal line RSE2' may become the first alignment signal line RSE1 and the second alignment signal line RSE2 respectively that meet the first scribing line SCRL1, i.e., the second peripheral edge SUBb of the substrate SUB as shown in FIG. 11 after they have been broken along the first scribing line SCRL1.

Hereinafter, a display device according to an embodiment of the disclosure will be described. In the following description, a same or similar elements will be denoted by a same or similar reference numerals, and redundant descriptions will be omitted or briefly described.

Figure 23:
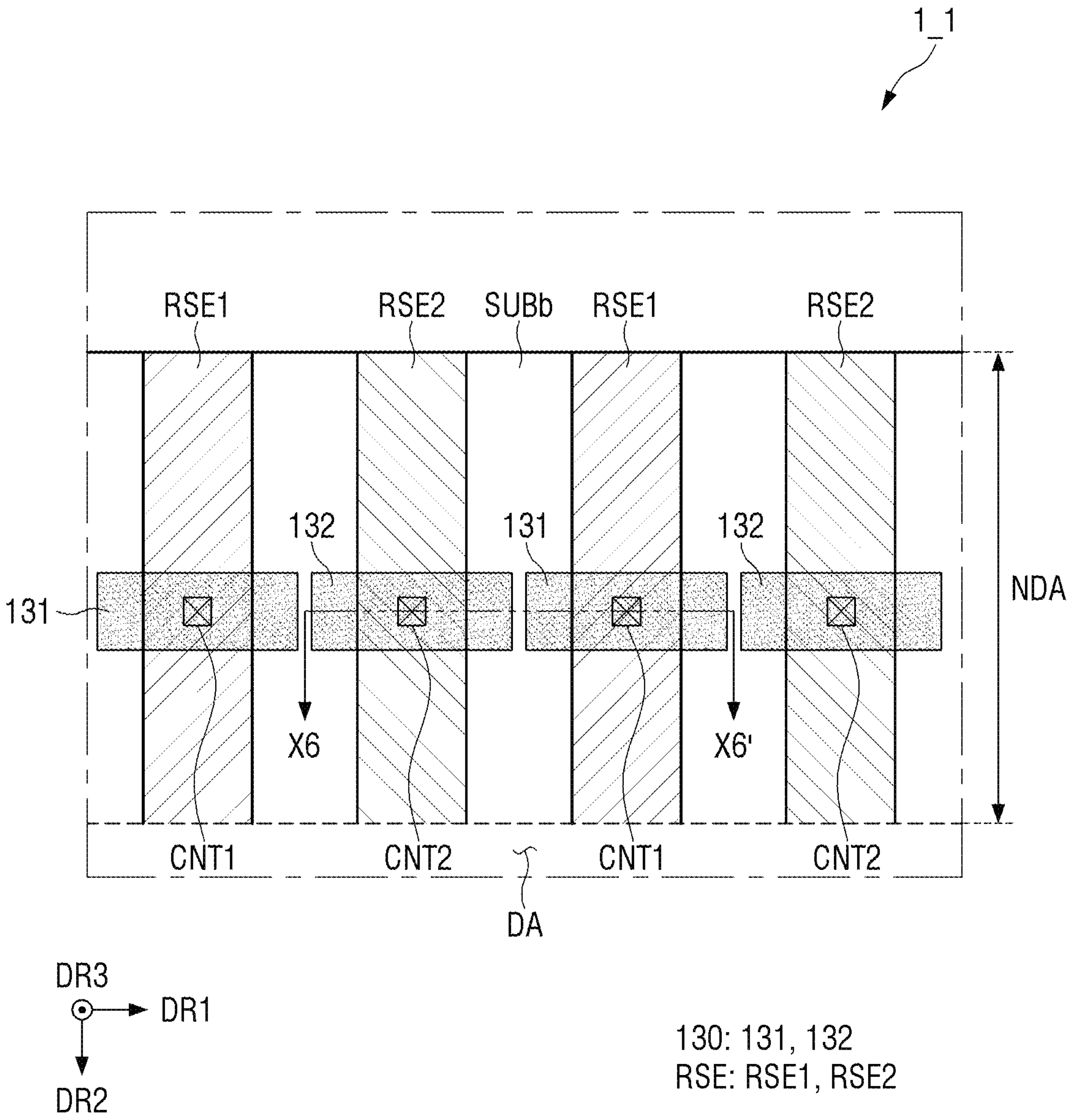
FIG. 23 is a plan view showing the structure of alignment signal lines and a ground pattern part of a display device according to an embodiment.
Figure 24:
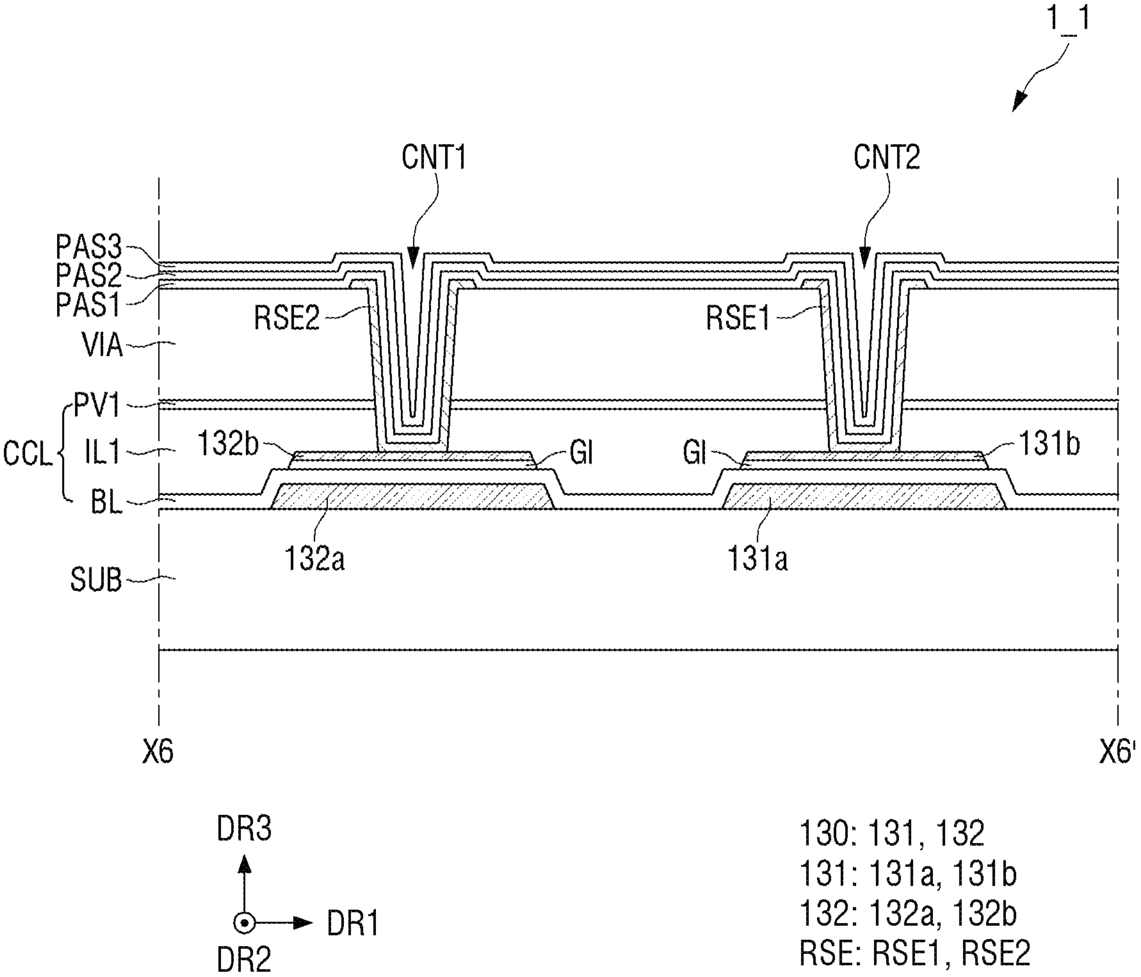
FIG. 24 is a schematic cross-sectional view taken along line X6-X6' of FIG. 23.

FIG. 23 is a plan view showing the structure of alignment signal lines and a ground pattern part of a display device according to an embodiment. FIG. 24 is a schematic cross-sectional view taken along line X6-X6' of FIG. 23.

Referring to FIGS. 23 and 24, in a display device 1_1 according to this embodiment, first alignment signal lines RSE1 and first ground patterns 131 may be electrically connected to each other, and second alignment signal lines RSE2 and second ground patterns 132 may be electrically connected to each other.

For example, the first alignment signal line RSE1 may be in direct contact with the second layer 131*b* of the first ground pattern 131 and may be electrically connected to the first ground pattern 131 through a first contact hole CNT1 that penetrates through a via insulating layer VIA, a first protective layer PV1, and a first interlayer dielectric layer IL1. The second alignment signal line RSE2 may be in direct contact with the second layer 132*b* of the second ground pattern 132 and may be electrically connected to the second ground pattern 132 through a second contact hole CNT2 that penetrates through the via insulating layer VIA, the first protective layer PV1, and the first interlayer dielectric layer IL1.

Accordingly, a same voltage as that of the first alignment signal line RSE1 may be applied to the first ground pattern 131, and a same voltage as that of the second alignment signal line RSE2 may be applied to the second ground pattern 132, so that it is possible to prevent or reduce damage caused by a voltage difference.

In concluding the detailed description, those skilled in the art will appreciate that many variations and modifications can be made to the embodiments without substantially departing from the principles of the invention. Therefore, the disclosed embodiments of the invention may be used in a generic and descriptive sense only and not for purposes of limitation.

What is claimed is:

1. A display device, comprising:
a display area and a non-display area surrounding the display area;
a substrate;
a plurality of pixels disposed in the display area;
a grounding part disposed in the non-display area; and
a flexible printed circuit board disposed in the non-display area to apply a driving signal to drive the pixels, wherein:
the non-display area comprises a first portion, a second portion, a third portion, and a fourth portion, wherein the flexible printed circuit board being disposed in the fourth portion, and
the second portion being disposed opposite from the fourth portion and being spaced-apart from the fourth portion by the display area, and
the grounding part comprises a first ground pattern and a second ground pattern that are arranged alternately in the second portion of the non-display area and are electrically isolated from each other.

2. A display device, comprising:
a display area and a non-display area surrounding the display area;
a substrate;
a plurality of pixels disposed in the display area;
a grounding part disposed in the non-display area; and
a flexible printed circuit board disposed in the non-display area to apply a driving signal to drive the pixels, wherein:
the non-display area comprises a first portion, a second portion, a third portion, and a fourth portion, wherein the flexible printed circuit board being disposed in the fourth portion, and
the second portion being disposed opposite from the fourth portion and being spaced-apart from the fourth portion by the display area,
the grounding part comprises a first ground pattern and a second ground pattern that are arranged alternately in the second portion of the non-display area
the first portion extends from an end of the fourth portion to another end of the second portion,
the third portion being disposed opposite from the first portion and being spaced-apart from the first portion by the display area, and
wherein the grounding part further comprises:
a first ground line being arranged in the first portion; and
a second ground line being arranged in the third portion.

3. The display device of claim 2, wherein
the substrate comprises a first peripheral edge, a second peripheral edge, a third peripheral edge, and a fourth peripheral edge, the third peripheral edge being arranged opposite from the first peripheral edge and extending from an end of the second peripheral edge to an end of the fourth peripheral edge, the second peripheral edge being arranged opposite from the fourth peripheral edge, the first peripheral edge extending from another end of the second peripheral edge to another end of the fourth peripheral edge, and
the first portion of the non-display area is arranged between the first peripheral edge and the display area, the second portion thereof is arranged between the second peripheral edge and the display area, the third portion thereof is arranged between the third peripheral edge and the display area, and the fourth portion thereof is arranged between the fourth peripheral edge and the display area.

4. The display device of claim 3, wherein the first ground pattern and the second ground pattern are spaced apart from each of the second peripheral edge and the display area.

5. The display device of claim 4, further comprising:
a first signal line and a second signal line being arranged alternately in the second portion of the non-display area, wherein
at least a part of the first signal line overlaps the first ground pattern in a thickness direction, and
at least a part of the second signal line overlaps the second ground pattern in the thickness direction.

6. The display device of claim 5, wherein the first signal line and the second signal line each extend from the second peripheral edge to the display area.

7. The display device of claim 6, wherein the first ground pattern and the second ground pattern each extend in a direction intersecting a direction in which each of the first signal line and the second signal line extend.

8. The display device of claim 5, wherein the first ground pattern and the second ground pattern are spaced apart from each other, and the first signal line and the second signal line are spaced apart from each other.

9. The display device of claim 8, wherein a first voltage is applied to each of the first signal line and the first ground pattern, and a second voltage having a level different from a level of the first voltage is applied to each of the second signal line and the second ground pattern.

10. The display device of claim 9, wherein the first signal line and the first ground pattern are electrically connected to each other, and the second signal line and the second ground pattern are electrically connected to each other.

11. A display device, comprising:

a display area and a non-display area surrounding the display area;

a substrate;

a plurality of pixels disposed in the display area;

first and second signal lines alternately and repeatedly arranged in the non-display area; and a first ground pattern and a second ground pattern alternately and repeatedly arranged in the non-display area, wherein the first signal line and the first ground pattern overlap each other in a thickness direction and each receive a first voltage, and the second signal line and the second ground pattern overlap each other in the thickness direction and each receive a second voltage having a level different from a level of the first voltage.

12. The display device of claim 11, further comprising:

a via insulating layer disposed between the substrate and the first signal line and between the substrate and the second signal line in the non-display area, the via insulating layer extending into the display area, wherein the first signal line and the second signal line are in direct contact with an upper surface of the via insulating layer.

13. The display device of claim 12, wherein each of the pixels comprise:

a first electrode and a second electrode spaced apart from each other; and a plurality of light-emitting elements disposed in a space between the first electrode and the second electrode, and the first electrode and the second electrode are in direct contact with the upper surface of the via insulating layer.

14. The display device of claim 13, wherein the first electrode, the second electrode, the first signal line and the second signal line comprises a same material.

15. The display device of claim 14, further comprising:

a thin-film transistor disposed between the via insulating layer and the substrate in the display area and driving the light-emitting elements, wherein the thin-film transistor comprises a bottom metal layer that is in direct contact with an upper surface of the substrate, in the non-display area, each of the first ground pattern and the second ground pattern comprises a first layer and a second layer disposed on the first layer, and the first layer of each of the first ground pattern and the second ground pattern is in direct contact with the upper surface of the substrate.

16. The display device of claim 15, wherein the first layer of the first ground pattern, the first layer of the second ground pattern, and the bottom metal layer of the thin-film transistor comprises a same material.

17. The display device of claim 15, wherein in the display area, the thin-film transistor further comprises:

a buffer layer disposed on the bottom metal layer;

a semiconductor layer disposed on the buffer layer;

a gate insulator disposed on the semiconductor layer; and a gate electrode disposed on the gate insulator, and the gate electrode of the thin-film transistor, the second layer of the first ground pattern, and the second layer of the second ground pattern comprises of a same material.

18. The display device of claim 17, wherein the buffer layer and the gate insulator each extend into the non-display area, in the non-display area, the buffer layer is disposed on the first layer of the first ground pattern and on the first layer of the second ground pattern, the gate insulator is in direct contact with an upper surface of the buffer layer, and the second layer of the first ground pattern and the second layer of the second ground pattern are both in direct contact with an upper surface of the gate insulator.

19. The display device of claim 12, wherein the first ground pattern and the second ground pattern are both electrically insulated from each of the first signal line and the second signal line by the via insulating layer.

20. The display device of claim 12, wherein the first ground pattern and the second ground pattern are disposed between the substrate and the via insulating layer, the first signal line is in contact with and is electrically connected to the first ground pattern through a first contact hole that penetrates through the via insulating layer, and the second signal line is in contact with and electrically connected to the second ground pattern through a second contact hole that penetrates through the via insulating layer.

* * * * *